(12) United States Patent
Kim et al.

(10) Patent No.: US 12,101,980 B2
(45) Date of Patent: Sep. 24, 2024

(54) TRANSPARENT DISPLAY PANEL AND TRANSPARENT DISPLAY DEVICE INCLUDING THE SAME

(71) Applicant: LG Display Co., Ltd., Seoul (KR)

(72) Inventors: Euitae Kim, Paju-si (KR); Changsoo Kim, Paju-si (KR); Kiseob Shin, Paju-si (KR); Soyi Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/146,893

(22) Filed: Dec. 27, 2022

(65) Prior Publication Data

US 2023/0134185 A1   May 4, 2023

Related U.S. Application Data

(62) Division of application No. 17/088,317, filed on Nov. 3, 2020, now Pat. No. 11,557,644.

(30) Foreign Application Priority Data

Nov. 4, 2019 (KR) .......................... 10-2019-0139434

(51) Int. Cl.
*H10K 59/131* (2023.01)
*H10K 59/122* (2023.01)
*H10K 59/121* (2023.01)

(52) U.S. Cl.
CPC ....... *H10K 59/1315* (2023.02); *H10K 59/122* (2023.02); *H10K 59/1213* (2023.02)

(58) Field of Classification Search
CPC ............. H10K 59/122; H10K 59/1213; H10K 59/1315

USPC ......................................................... 257/40
See application file for complete search history.

(56) References Cited

U.S. PATENT DOCUMENTS

| | | | |
|---|---|---|---|
| 9,218,764 B2 | 12/2015 | Yoon et al. | |
| 11,362,167 B2 | 6/2022 | Li et al. | |
| 2006/0060850 A1 | 3/2006 | Kwak et al. | |
| 2014/0176399 A1 | 6/2014 | Lee et al. | |
| 2014/0299867 A1 | 10/2014 | Ono et al. | |
| 2014/0368416 A1 | 12/2014 | Gu et al. | |
| 2015/0279271 A1* | 10/2015 | Xi | H10K 59/131 345/76 |
| 2015/0294612 A1 | 10/2015 | Kim et al. | |

(Continued)

FOREIGN PATENT DOCUMENTS

| | | |
|---|---|---|
| CN | 103972271 A | 8/2014 |
| CN | 110310976 A | 10/2019 |
| KR | 20140083142 A | 7/2014 |

*Primary Examiner* — Dzung Tran

(74) *Attorney, Agent, or Firm* — Seed IP Law Group LLP

(57) ABSTRACT

A transparent display panel and a transparent display device including the same are disclosed. In a transparent display panel, a VSS voltage line does not surround an outer periphery of a display region. Rather, upper and lower VSS voltage lines respectively disposed on upper and lower sides to the display region are electrically connected to each other via at least one VSS voltage connection line extending across the display region. Thus, left and right non-transparent and thick VSS voltage lines disposed on the left and right sides to the display region may be omitted. Thus, a transparent region of the transparent display panel and a bezel of a transparent display device may be increased or maximized or the bezel thereof may be made slim.

11 Claims, 18 Drawing Sheets

(56) References Cited

U.S. PATENT DOCUMENTS

| | | |
|---|---|---|
| 2016/0190228 A1 | 6/2016 | Park |
| 2016/0203765 A1 | 7/2016 | Lee |
| 2016/0260383 A1* | 9/2016 | Shin .................... G09G 3/3233 |
| 2017/0061888 A1 | 3/2017 | Nam et al. |
| 2017/0365217 A1 | 12/2017 | An et al. |

* cited by examiner

TRANSPARENT DISPLAY PANEL AND TRANSPARENT DISPLAY DEVICE INCLUDING THE SAME

CROSS-REFERENCE TO RELATED APPLICATIONS

This application is a divisional of U.S. patent application Ser. No. 17/088,317, filed Nov. 3, 2020; which claims the benefit of Korean Patent Application No. 10-2019-0139434 filed on Nov. 4, 2019, in the Korean Intellectual Property Office, the disclosure of which is hereby incorporated by reference in its entirety.

BACKGROUND

Technical Field

The present disclosure relates to a transparent display panel having a bezel having an increased transparent region or having a reduced bezel region, that is, a slim bezel, and a transparent display device including the panel.

Description of the Related Art

A display device that displays various information using an image includes a plasma display panel (PDP) based device, a liquid crystal display device (LCD), and an organic light emitting diode based display device (OLED).

As an image implementation skill is advanced, in recent years, a demand for a transparent display device having a transparent region in which at least a partial region of the display device is transparent has increased.

A transparent display device means a display device in which at least a partial region on which information is displayed is transparent to transmit light, so that an object or a background behind the display device is visible to a user in front of the device.

The transparent display device transmits light in front and rear directions. Thus, the device may display information in the front and rear directions of the display device, such that front and rear users in front and rear of the display device may see objects or backgrounds opposite thereto respectively.

For example, the transparent display device implemented as an organic light-emitting display device may include a transparent region that transmits incident light as it is and a light-emitting region that emits light.

BRIEF SUMMARY

The transparent display device requires various lines that supply data voltage or power voltage, etc. In general, the lines are non-transparent and thick in consideration of an electrical resistance.

In particular, when the non-transparent and thick lines as described above are disposed in a bezel of the transparent display device, a size of the transparent region is reduced accordingly due to presence of the non-transparent lines therein.

Further, when the non-transparent and thick lines are disposed in the bezel of the transparent display device, a space in which the thick lines are received must be secured, thereby to cause a limitation in slimming the bezel.

Accordingly, the inventors of the present disclosure have invented a transparent display panel having a bezel having an increased or maximized transparent region or having a reduced or minimized bezel region, that is, a slim bezel, and a transparent display device including the panel.

One or more embodiments of the present disclosure provides a transparent display panel in which a size of a transparent region of a bezel is increased or maximized by reducing or minimizing a size of a portion of the transparent region of the bezel that is screened by a non-transparent line, and a transparent display device including the panel.

Further, one or more embodiments of the present disclosure provides a transparent display panel having a slimmed bezel by reducing or minimizing an area a portion of a bezel as occupied by a non-transparent line, and a transparent display device including the same.

Furthermore, one or more embodiments of the present disclosure provides a transparent display panel in which a size of a transparent region in a GIP (gate in panel) circuit region disposed in a bezel is increased to maximize a size of a transparent region of the bezel, and a transparent display device including the same.

The technical benefits of the present disclosure are not limited to the above-mentioned benefits. Other benefits and advantages of the present disclosure, as not mentioned above, may be understood from the following descriptions and more clearly understood from the embodiments of the present disclosure. Further, it will be readily appreciated that the advantages of the present disclosure may be realized by features and combinations thereof as disclosed in the claims.

In one embodiment of the present disclosure, there are provided a transparent display panel having a bezel having an increased or maximized transparent region or having a reduced or minimized bezel region, that is, a slim bezel, and a transparent display device including the panel.

A transparent display panel according to one embodiment of the present disclosure includes a display region and a non-display region, the display panel comprising: a first VSS voltage line and a second VSS voltage line disposed in the non-display region while the display region is interposed between the first VSS voltage line and the second VSS voltage line; and at least one VSS voltage connection line electrically connecting the first VSS voltage line and the second VSS voltage line to each other, wherein the VSS voltage connection line is disposed in the display region.

A transparent display panel according to another embodiment of the present disclosure comprises a display region including a light-emitting region and a transmissive region; a first VSS voltage line and a second VSS voltage line while the display region is interposed therebetween; and a GIP (gate in panel) circuit region disposed in at least one side region out of the display region, wherein the first VSS voltage line and the second VSS voltage line are electrically connected to each other to at least one VSS voltage connection line, wherein the VSS voltage connection line extends across the display region.

In this way, in the transparent display panel according to the present disclosure, the upper and lower VSS voltage lines disposed above and below the display region are electrically connected to each other via the at least one VSS voltage connection line extending across the display region. Thus, the non-transparent VSS voltage lines respectively disposed on the left and right regions to the display region may be omitted.

Thus, the transparent display panel and the transparent display device according to the present disclosure may increase or maximize the transparent region of the bezel or allow the bezel to be slim as much as a size of an area where the non-transparent VSS voltage lines are omitted.

According to the present disclosure, the VSS voltage line does not surround an outer periphery of the display region. Rather, the VSS voltage lines disposed above and below the display region are electrically connected to each other via at least one VSS voltage connection line extending across the display region. Thus, left and right non-transparent VSS voltage lines disposed on the left and right sides to the display region may be omitted. The transparent region of the transparent display panel and the bezel of the transparent display device may be increased or maximized.

Further, according to the present disclosure, the VSS voltage line does not surround the outer periphery of the display region. Rather, the VSS voltage lines disposed above and below the display region are electrically connected to each other via at least one VSS voltage connection line extending across the display region. Thus, left and right thick VSS voltage lines disposed on the left and right sides to the display region may be omitted. Thus, the bezel of the transparent display panel and transparent display device may be made slim.

Further, according to the present disclosure, a region of the bezel is further secured to be used as a transparent region in the GIP circuit region when left and right thick and non-transparent VSS voltage lines disposed on the left and right sides to the display region are omitted. Thus, the transparent in the bezel of the transparent display panel and the transparent display device may be increased or maximized.

Further specific effects of the present disclosure as well as the effects as described above will be described in connection with illustrations of specific details for carrying out the present disclosure.

DETAILED DESCRIPTION

Figure 1:
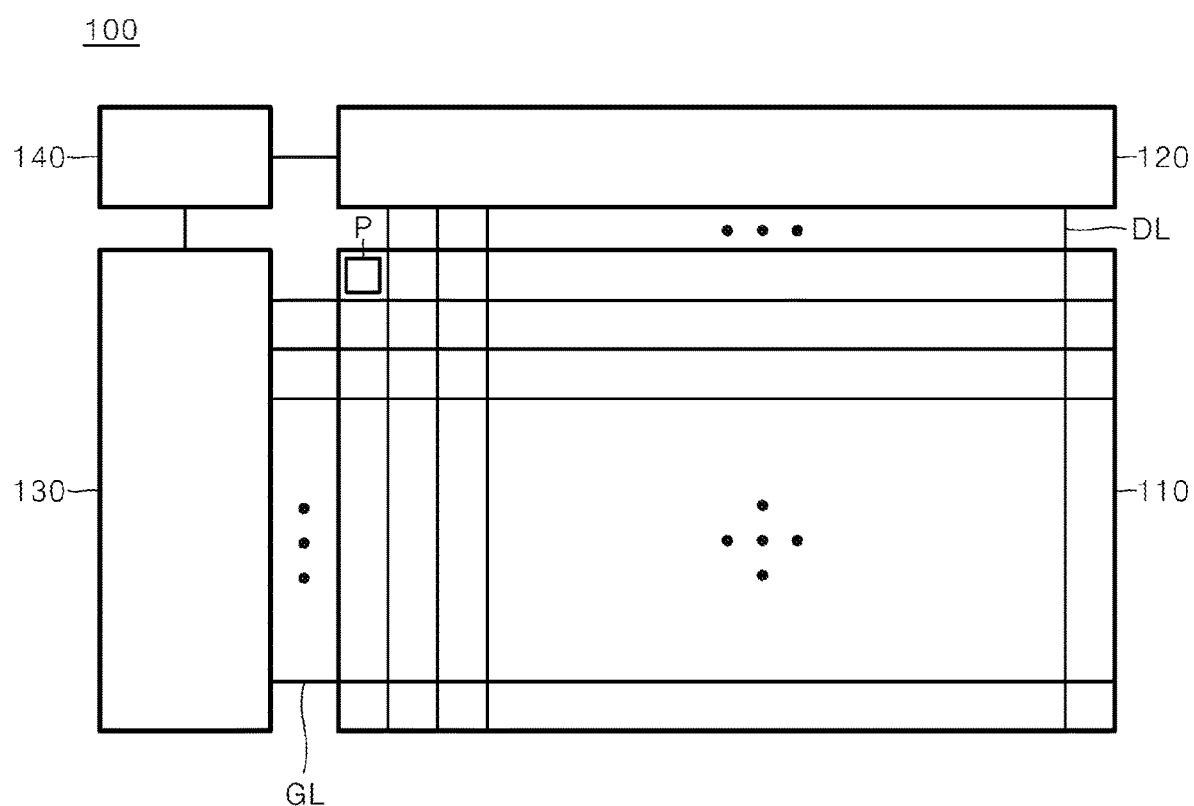
FIG. 1 is a block diagram schematically illustrating a system of a transparent display device.

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a transparent display panel according to some embodiments of the present disclosure and a transparent display device including the same will be exemplified.

Figure 2:
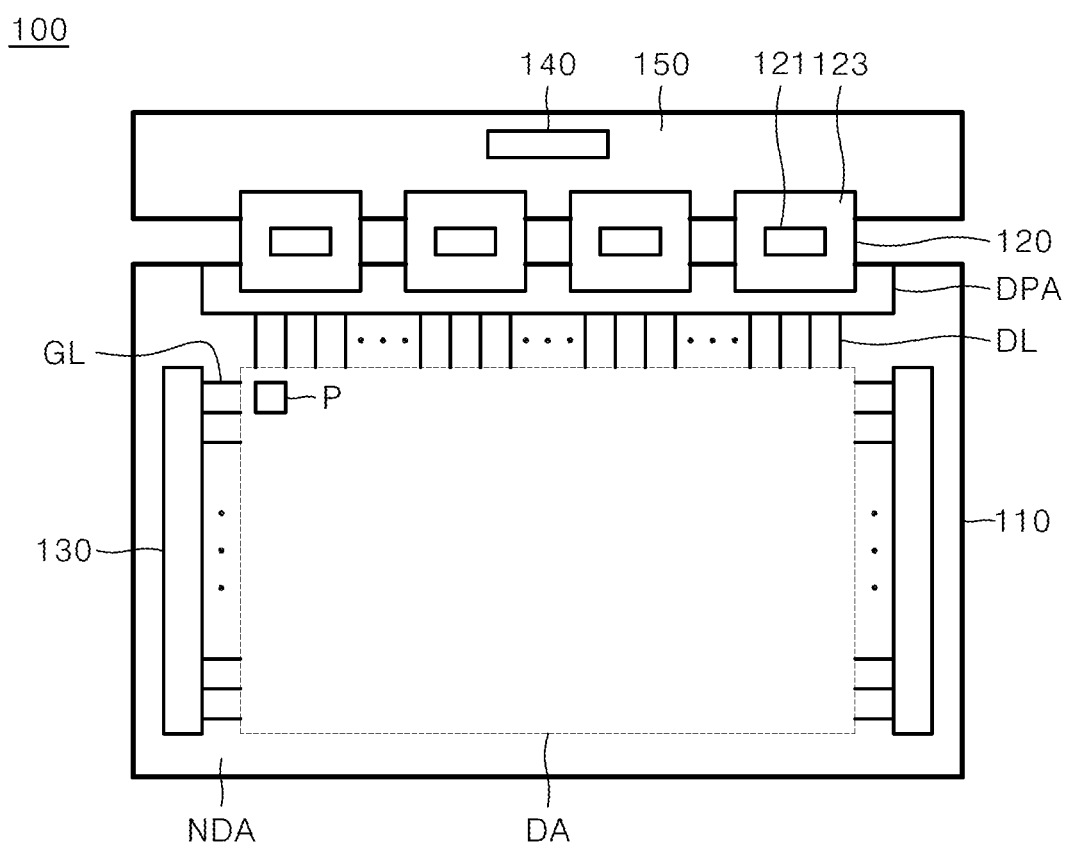
FIG. 2 is a plan view for schematically illustrating connection and arrangement relationships of components constituting a transparent display device.

FIG. 1 is a block diagram for schematically illustrating a transparent display device according to an embodiment of the present disclosure. FIG. 2 is a plan view for schematically illustrating connection and arrangement relationships of components constituting a transparent display device according to an embodiment of the present disclosure.

However, each of FIG. 1 and FIG. 2 is an embodiment according to the present disclosure. Thus, the connection and arrangement relationships of the components of the transparent display device 100 according to the present disclosure are not limited thereto.

The transparent display device 100 may include a transparent display panel 110, a timing controller 140, a data driver 120, and a gate driver 130.

The transparent display panel 110 may include a display region DA containing at least one pixel P to display an image, and a non-display region NDA in which an image is not displayed.

The non-display region NDA may be disposed to surround the display region DA.

In the non-display region NDA, the gate driver 130, a data drive IC pad DPA, and various lines may be disposed. The non-display region NDA may correspond to a bezel.

The transparent region of the transparent display panel 110 may be contained in both the display region DA and the non-display region NDA.

The transparent display panel 110 may include a plurality of pixel regions defined by a plurality of gate lines GL extending in a first direction, and a plurality of data lines DL extending in a second direction orthogonal to the gate lines GL.

The pixel regions may be arranged in a matrix form. Each pixel region may include a pixel P composed of at least one sub-pixel SP.

The gate driver 130 controls on/off of driving thin-film transistors 210 of the pixels.

To this end, the gate driver 130 sequentially outputs gate signals such as a scan signal or a light-emitting signal, and sequentially supplies the gate signals to the gate lines GL.

Thus, a data voltage may be applied to a sub-pixel corresponding to a pixel circuit connected to a specific gate line GL.

The gate driver 130 may include at least one gate driver integrated circuit (gate driver IC). The gate driver may be located on one side or both sides to the transparent display panel 110 depending on a driving scheme or a design scheme of the transparent display panel 110.

Each gate driver integrated circuit (IC) may be implemented in a chip on glass (COG) manner or a chip on film (COF) manner.

Further, as shown in FIG. 2, in the gate driver 130, various elements such as transistors are directly stacked on the transparent display panel 110 in a form of GIP (Gate In Panel) via a photolithography process.

In this case, a plurality of GIP circuit regions may be arranged in the GIP form and may be disposed in left and right portions of the non-display region NDA respectively adjacent to left and right outer peripheral portions of the display region DA while the display region DA is interposed between the left and right portions of the non-display region NDA.

When a specific gate line GL is opened, the data driver 120 converts image data received from the timing controller 140 to a data voltage in an analog form and then synchronizes the data voltage with a gate control signal and then supply the data voltage to a data line DL.

Further, the data driver 120 may serve as a passage through which various power lines pass.

The data driver 120 may include at least one source driver integrated circuit 121 (source driver IC) to drive a plurality of data lines DL.

Each source driver integrated circuit 121 may be implemented in a chip on glass (COG) manner or a chip on film (COF) manner.

For example, as shown in FIG. 2, a source driving chip corresponding to each source driver integrated circuit 121 may be mounted on a flexible film 123. One end of the flexible film 123 may be bonded to at least one control printed circuit board 150, while the other end thereof may be bonded to a data drive IC pad (DPA) of the transparent display panel 110.

A plurality of circuits implemented as driving chips may be mounted on the control printed circuit board 150. For example, as shown in FIG. 2, the timing controller 140 may be disposed on the control printed circuit board 150.

Further, a power controller that supplies various voltages or currents to the transparent display panel 110, the data driver 120 and the gate driver 130 or controls various voltages or currents to be supplied thereto may be further disposed on the control printed circuit board 150.

In addition, a source printed circuit board may be additionally disposed between the flexible film 123 and the control printed circuit board 150. In this case, the source printed circuit board may be connected to the control printed circuit board 150 via a connection medium such as a flexible flat cable (FFC) or a flexible printed circuit (FPC).

The timing controller 140 provides the gate control signal to the gate driver 130, and provides the data control signal to the data driver 120 to control the data driver 120 and the gate driver 130.

In one example, the transparent display device 100 may be embodied as a liquid crystal display device, an organic light-emitting display device, etc. However, the present disclosure is not limited thereto. Hereinafter, in accordance with an embodiment of the present disclosure, an example in which the transparent display device 100 may be embodied as an organic light-emitting display device will be described with reference to FIG. 3 and FIG. 4.

Figure 3:
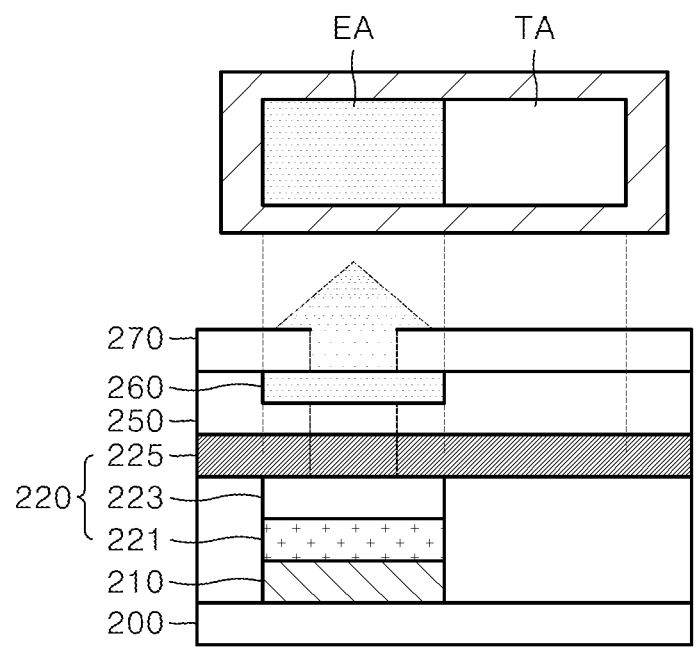
FIG. 3 is a schematic cross-sectional view of light-emitting and transmissive regions of a pixel in an organic light-emitting display panel.
Figure 4:
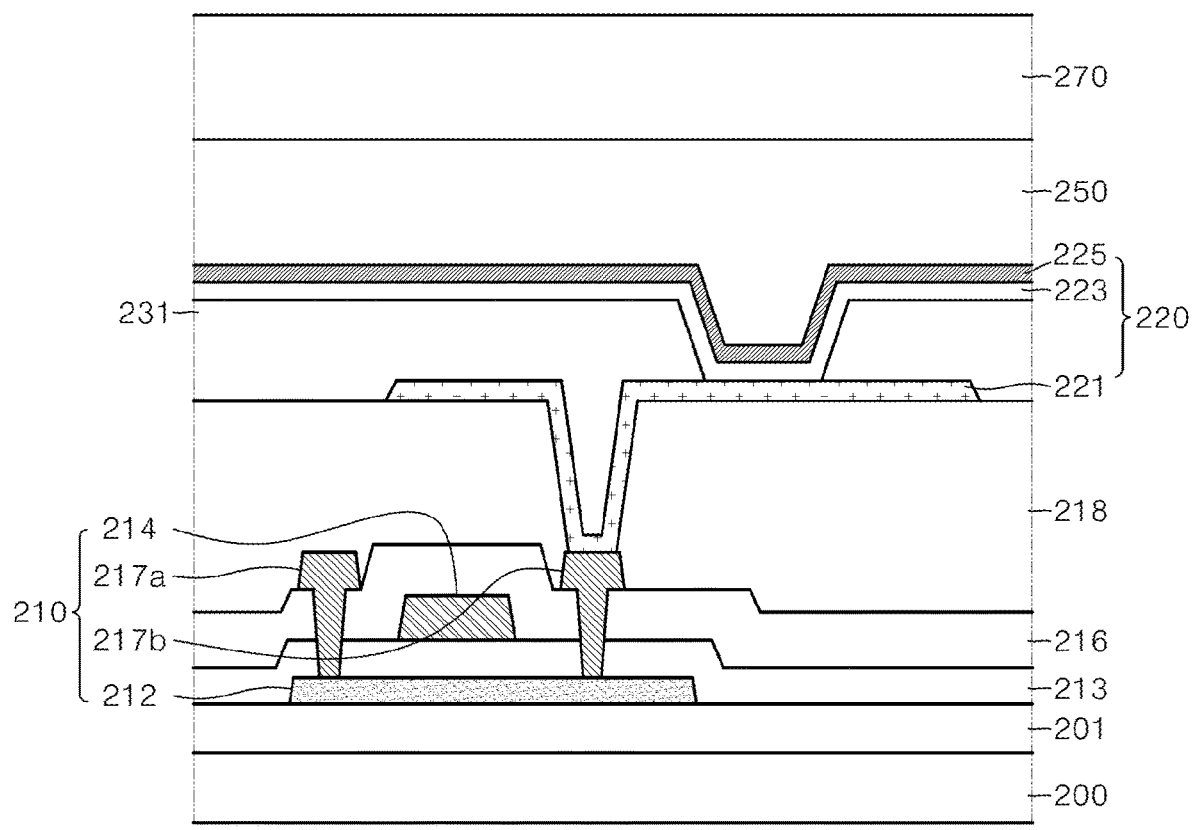
FIG. 4 is a more detailed cross-sectional view of a light-emitting region of a pixel in an organic light-emitting display panel.

FIG. 3 is a schematic cross-sectional view of a pixel light-emitting region EA and a transmissive region TA of a pixel in an organic light-emitting display panel. FIG. 4 is a more detailed cross-sectional view of a light-emitting region EA of a pixel in an organic light-emitting display panel.

The transparent display panel may include a first substrate 200 and a second substrate 270.

The first substrate 200 may act as a base substrate including a display region DA in which pixels are disposed, and a non-display region NDA in which the gate driver 130, the data drive IC pad 310, and various lines are disposed.

The second substrate 270 may be opposite to the first substrate 200 and may act as an encapsulating substrate.

Each of the first substrate 200 and the second substrate 270 may be embodied as a plastic substrate or a glass substrate.

The display region DA of the first substrate 200 includes a light-emitting region EA and a transmissive region TA, as shown in FIG. 3.

Each sub-pixel may be disposed in the light-emitting region EA.

Each sub-pixel may be a red sub-pixel emitting red light, or may be a green sub-pixel emitting green light, or may be a blue sub-pixel emitting blue light, or may be a sub-pixel emitting light, for example, white light other than the red, green or blue light.

Each sub-pixel may include a light-emitting region EA for emitting light of a corresponding color, and a circuit region electrically connected to the light-emitting region EA to control light-emission from the light-emitting region EA.

For example, when, in the transparent display panel according to an embodiment of the present disclosure, one pixel is composed of three color sub-pixels, a first color sub-pixel includes a first color light-emitting region EA and a first color circuit region electrically connected to the first color light-emitting region EA, a second color sub-pixel includes a second color light-emitting region EA, and a second color circuit region that is electrically connected to the second color light-emitting region EA, and a third color sub-pixel includes a third color light-emitting region EA, and a third color circuit region that is electrically connected to the third color light-emitting region EA.

The light-emitting region EA of the sub-pixel may refer to a region in which light of a corresponding color to each sub-pixel is emitted or may refer to a pixel electrode such as an anode electrode that exists in each sub-pixel, or may mean a region where the pixel electrode is disposed.

The light-emitting region EA includes an organic light-emitting element 220 including an anode electrode as a first electrode 221, an organic light-emitting layer 223, and a cathode electrode as a second electrode 225. The organic light-emitting element 220 emits light at a predefined brightness using a voltage supplied to the first electrode 221 and a voltage supplied to the second electrode 225.

In this case, the second electrode 225 as a transparent electrode may extend across both the light-emitting region EA and the transmissive region TA.

The circuit region of the sub-pixel means a circuit region including the driving thin-film transistor 210 that supplies a voltage or a current to the pixel electrode of each sub-pixel to control light emission from the light-emitting region EA or may mean a region in which the circuit region is disposed.

The driving thin-film transistor 210 includes a gate electrode 214, a source electrode 217a, a drain electrode 217b and an active layer 212. The driving thin-film transistor 210 may employ various types.

When the circuit region receives a gate signal from the gate line GL using the thin-film transistors, the circuit region may supply a predefined voltage to the first electrode 221 of the organic light-emitting element 220 of the light-emitting region EA based on a data voltage of the data line DL.

The circuit region may vertically at least partially overlap with the light-emitting region EA, but may be disposed at an opposite side to a side from which light is emitted so as not to interfere with the light emission.

An encapsulating layer 250 is formed on the organic light-emitting element 220, specifically, the second electrode 225 thereof. A color filter 260 corresponding to the organic light-emitting element 220 may be formed on the encapsulating layer 250.

The color filter 260 may have the same color as or a different color from that of a corresponding sub-pixel.

The transmissive region TA refers to a region that transmits incident light, and may be a region excluding the circuit region. A transmittance of the transparent display device depends on an area of the transmissive region TA.

FIG. 3 shows one embodiment of the present disclosure in which the light-emitting region EA and the transmissive region TA corresponds to one sub-pixel. However, the present disclosure is not limited thereto. The arrangement form of the light-emitting region EA and the transmissive region TA of the transparent display device according to the present disclosure is not limited thereto.

For example, in one embodiment of the present disclosure, an arrangement form in which a plurality of light-emitting regions EA correspond to a single transmissive region TA, for example, an arrangement form in which a plurality of light-emitting regions EA surrounds a single transmissive region TA may be realized. Further, various arrangement forms of the light-emitting region EA and the transmissive region TA may be realized.

FIG. 4 is a more detailed cross-sectional view of a light-emitting region EA corresponding to one sub-pixel in an organic light-emitting display device according to an embodiment of the present disclosure.

Over the first substrate 200, a driving thin-film transistor 210 as a driving element, and an organic light-emitting element 220 connected to the driving thin-film transistor 210 are disposed. A buffer layer 201 may be formed on the first substrate 200, and a gate insulation layer 213 may be formed on the active layer 213, and an interlayer insulation layer 216 may be formed on the gate electrode 214.

A passivation layer 218 may be formed on the driving thin-film transistor 210 to cover the driving thin-film transistor 210. A contact-hole exposing a drain electrode 217b may be formed in the passivation layer 218.

The passivation layer 218 may act as a planarization layer made of an organic insulating material.

The first electrode 221 constituting the organic light-emitting element 220 is formed on the passivation layer 218. The first electrode 221 is electrically connected to the drain electrode 217b via the contact-hole defined in the passivation layer 218. Thus, the driving thin-film transistor 210 and the first electrode 221 on the passivation layer 218 may be electrically connected to each other.

The first electrode 221 may act as an anode electrode that serves to inject holes and may be made of a materials with a high work function.

In this case, the first electrode may be embodied as a transparent electrode made of at least one transparent conductive material such as indium tin oxide (ITO), antimony tin oxide (ATO), and indium zinc oxide (IZO).

A bank layer 231 is formed on and over the passivation layer 218. Sub-pixels may be separated from each other via the bank layer 231 to form a border between adjacent light-emitting region EAs to render corresponding colors respectively. The bank layer 231 may have a bank-hole defined therein corresponding to a sub-pixel region to partially expose the first electrode 221.

The organic light-emitting layer 223 may be formed on a top face of the bank layer 231 and on a top face of a portion of the first electrode 221 exposed through the bank-hole. A region where the organic light-emitting layer 223 contacts the first electrode 221 may correspond to a sub-pixel region, more specifically, the light-emitting region EA.

The organic light-emitting layer 223 may include a hole injection layer (HIL), a hole transport layer (HTL), a light-emitting layer (EML), an electron transport layer (ETL), an electron injection layer (EIL).

The light-emitting layer (EML) may emit red R, green G or blue B light and may be made of a phosphorescent material or a fluorescent material that emits a corresponding color.

In this case, each of the hole injection layer (HIL), the hole transport layer (HTL), the electron transport layer (ETL), and the electron injection layer (EIL) may occupy an entire display region. The light-emitting layer EML may be patterned to correspond to each color region, specifically, the first electrode 221.

However, the present disclosure is not limited thereto. Each of the hole injection layer (HIL), the hole transport layer (HTL), the electron transport layer (ETL), and the electron injection layer (EIL) may be patterned to correspond to each color region, specifically, the first electrode 221.

In some embodiments, the second electrode 225 is formed on the organic light-emitting layer 223 and over an entirety of the first substrate 200. The second electrode 225 is disposed on an entirety of the display region DA of the first substrate 200. In this case, the second electrode 225 may be disposed on an entirety of the display region DA except for the transmissive region TA.

The second electrode 225 may act as a cathode electrode that serves to inject electrons and may be made of metal with a low work function to inject electrons well.

In this case, the second electrode 225 may include at least one of materials such as Ca, Al: Li, Mg: Ag, and Ag.

Further, the second electrode 225 may be embodied as a transparent electrode made of at least one of transparent conductive materials such as indium tin oxide (ITO), antimony tin oxide (ATO), and indium zinc oxide (IZO).

On the organic light-emitting element 220, an encapsulating layer 250 is formed that prevents external moisture from penetrating the organic light-emitting element 220.

The encapsulating layer 250 may be formed of a multi-layer in which an inorganic layer and an organic layer are alternately stacked one on top of the other. However, the present disclosure is not limited thereto.

On the encapsulating layer 250, the second substrate 270 as the encapsulating substrate opposite to the first substrate 200 may be formed.

In this case, a barrier layer may be formed between the encapsulating layer 250 and the second substrate 270 to more effectively prevent external moisture or oxygen from penetrating the organic light-emitting element 220.

The barrier layer may be manufactured in a film form and adhered to the encapsulating layer 250 by means of an adhesive.

Figure 5:
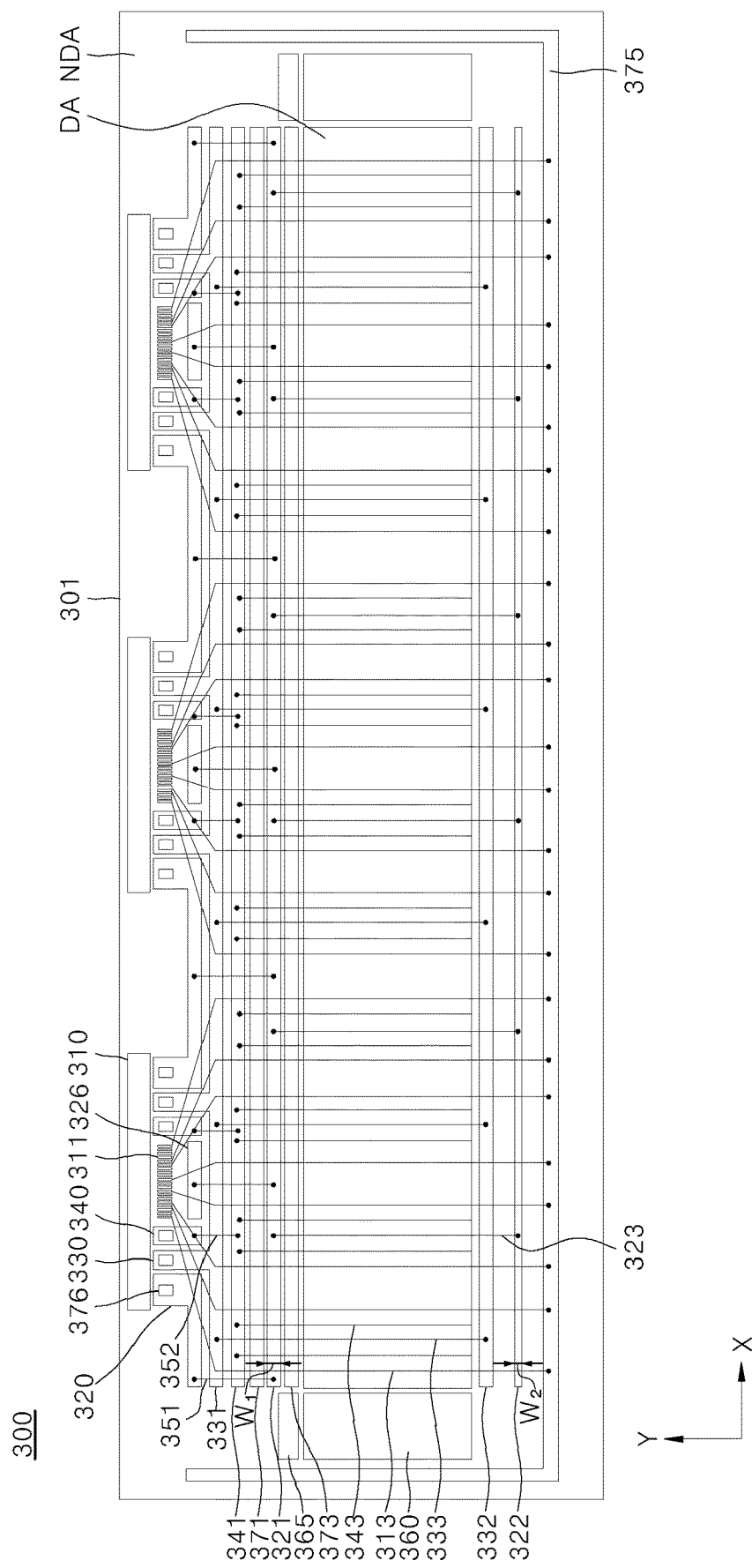
FIG. 5 shows a connection relationship of line connection pads disposed on a first substrate in a transparent display panel according to an embodiment of the present disclosure.

FIG. 5 shows a connection relationship of line connection pads disposed on the first substrate 301 in the transparent display panel 300 according to an embodiment of the present disclosure.

The first substrate 301 includes a display region DA and a non-display region NDA disposed to surround the display region DA.

That is, the non-display region NDA may be disposed to surround top, bottom, left, and right sides of the display region DA.

A vertical or up-down direction of the display region DA in an embodiment of the present disclosure refers to a Y-axis direction, as shown in FIG. 5, while a horizontal or left-right direction of the display region DA means a X-axis direction, as shown in FIG. 5.

The display region DA may have a rectangular shape including long sides and short sides.

In this case, the long side is relatively longer than the short side.

Further, the long side means a side parallel to the X-axis direction as the left and right direction of the display region DA.

The short side means a side parallel to the Y-axis direction as the vertical or up-down direction of the display region DA.

The gate driver 130 may be disposed in a form of GIP (gate in panel) and on at least one side to the display region DA.

In other words, a pair of GIP circuit regions 360 are disposed in portions of the non-display region NDA located on the left and right sides to the display region DA respectively.

For example, the GIP circuit region 360 is disposed along the short side of the display region DA. A first VSS voltage line 321 and a second VSS voltage line 322 may be disposed along the long side of the display region DA.

Therefore, the GIP circuit region 360 may be disposed on one side to the display region DA different from one side thereto where the first VSS voltage line 321 and the second VSS voltage line 322 are disposed.

On one portion of the non-display region NDA where the GIP circuit region 360 is disposed, a GIP ESD (electro-static discharge) protection circuit region 365 that operates when static electricity is introduced into the GIP circuit region 360 to reduce or minimize static electricity inflow may be disposed.

In FIG. 5, the GIP ESD protection circuit region 365 is disposed above the GIP circuit region 360 in the Y direction. However, the present disclosure is not limited thereto.

At least one data drive IC pad 310 may be disposed on one side to the display region DA where the GIP circuit region 360 is not disposed, for example, at a portion of the non-display region NDA above a top long side of the display region DA.

The data drive IC pad 310 is connected to various lines necessary for driving the transparent display panel 300 such as the power line and the data line.

Between the data drive IC pad 310 and the display region DA, a data line connection pad 311, a reference voltage line connection pad 340, a VSS voltage line connection pad 320, and a VDD voltage line connection pad 330 are disposed to be connected to each other via the data drive IC pad 310 and various lines.

Specifically, each of right and left reference voltage line connection pads 340, each of right and left VDD voltage line connection pads 330, and each of right and left VSS voltage line connection pads 320 may be disposed adjacent to each of right and left portions of the data drive IC pad 310. A spacing between each of right and left reference voltage line connection pads 340 and a length direction center of the data drive IC pad 310 is smaller than a spacing between each of right and left VDD voltage line connection pads 330 and the length direction center of the data drive IC pad 310 which is smaller than a spacing between each of right and left VSS voltage line connection pads 320 and the length direction center of the data drive IC pad 310.

That is, the both reference voltage line connection pads 340, the both VDD voltage line connection pads 330, and the both VSS voltage line connection pads 320 may be arranged symmetrically to each other around a center of the data line connection pad 311. In one or more embodiments, the term "symmetrically" used throughout in the specification is used to include the meaning of both symmetrically and substantially symmetrically.

The reference voltage line connection pad 340, the VDD voltage line connection pad 330, and the VSS voltage line connection pad 320 are arranged to be spaced apart from each other.

The VDD voltage line connection pad 330 may act as a high-level voltage power line connection pad that supplies high-level voltage power to a pixel for driving the pixel, while the VSS voltage line connection pad 320 may act as a low-level voltage power line connection pad that applies low-level voltage power to the pixel for driving the pixel.

The reference voltage line connection pad 340 may supply a reference voltage Vref to a pixel.

A reference voltage line 341 electrically connected to the reference voltage line connection pad 340, a first VDD voltage line 331 electrically connected to the VDD voltage line connection pad 330, and a first VSS voltage line 321 electrically connected to the VSS voltage line connection pad 320 may be disposed between the reference voltage line connection pad 340 and the display region DA, between the VDD voltage line connection pad 330 and the display region DA, and between the VSS voltage line connection pad 320 and the display region DA, respectively.

For example, the reference voltage line connection pad 340 and the reference voltage line 341 may be integrally formed with each other and electrically connected to each other or may be formed to be spaced apart from each other and may be electrically connected to each other via a separate connection electrode.

Further, the VDD voltage line connection pad 330 and the first VDD voltage line 331 may be formed integrally with each other and be electrically connected to each other, or may be formed to be spaced apart from each other and may be electrically connected to each other via a separate connection electrode.

In addition, the VSS voltage line connection pad 320 and the first VSS voltage line 321 may be integrally formed with each other and electrically connected to each other or may be formed to be spaced apart from each other and may be electrically connected to each other via a separate connection electrode.

Hereinafter, however, in one embodiment of the present disclosure, an arrangement form as shown in FIG. 5 in which the VDD voltage line connection pad 330 and the first VDD voltage line 331 are integrally formed with each other, the reference voltage line connection pad 340 and the reference voltage line 341 are formed to be spaced apart from each other and electrically connected to each other via a separate connection electrode, and the VSS voltage line connection pad 320 and the first VSS voltage line 321 are formed to be spaced apart from each other and electrically connected to each other via a separate connection electrode will be described.

The first VDD voltage line 331 may be formed to have a bar shape, and may extend parallel to one side face of the display region DA, specifically, along the long side of the display region DA and may be integrally formed with the VDD voltage line connection pad 330. In one or more embodiments, a bar shape may include a rectangular bar shape, an elongated bar shape, or even a bar shape closer to a square bar shape, or any other suitable shape for being implemented in a display device.

Further, the first VDD voltage line 331 may be formed integrally with a plurality of VDD voltage line connection pads 330 corresponding to each data drive IC pad 310 to electrically connect the plurality of VDD voltage line connection pads 330 to each other.

The reference voltage line 341 may be disposed between the first VDD voltage line 331 and the display region DA.

The reference voltage line 341 may act as an initial voltage line. However, the present disclosure is not limited thereto. Depending on a compensation circuit region, the reference voltage line 341 may act as a separate line from the initial voltage line.

However, in one embodiment of the present disclosure, an example in which the reference voltage line may act as the initial voltage line will be described.

Thus, the reference voltage line connection pad 340 may be disposed to be spaced apart from the reference voltage line 341 in the Y direction while a spacing between the former and the display region DA is larger than a spacing between the latter and the display region DA.

The reference voltage line 341 may be formed to have a bar shape, and may extend parallel to the first VDD voltage line 331.

The reference voltage line 341 is disposed to be spaced apart from the reference voltage line connection pad 340 while the first VDD voltage line 331 is disposed therebetween. Thus, in order to apply the reference voltage to the reference voltage line 341, the reference voltage line connection pad 340 and the reference voltage line 341 may be electrically connected to each other via a second connection electrode 352 as a separate connection electrode.

The first VSS voltage line 321 may be disposed between the reference voltage line 341 and the display region DA.

Thus, the VSS voltage line connection pad 320 may be disposed to be spaced apart from the first VSS voltage line 321 in the Y direction while a spacing between the former and the display region DA is larger than a spacing between the latter and the display region DA.

The first VSS voltage line 321 may be formed to have a bar shape and may extend in parallel with the first VDD voltage line 331 and the reference voltage line 341.

The first VSS voltage line 321 is spaced apart from the VSS voltage line connection pad 320 while the first VDD voltage line 331 and the reference voltage line 341 are interposed therebetween. Thus, in order to apply the VSS voltage to the first VSS voltage line 321, the VSS voltage line connection pad 320 and the first VSS voltage line 321 may be electrically connected to each other via a first connection electrode 351 as a separate connection electrode.

Further, a VSS voltage auxiliary line connection pad 326 as a separate portion from the VSS voltage line connection pad 320 may be disposed between the left and right reference voltage line connection pads 340.

Specifically, the VSS voltage auxiliary line connection pad 326 may have a form of an island spaced from and disposed between the left and right reference voltage line connection pads 340 and spaced from and disposed between the data line connection pad 311 and the VDD voltage line.

The VSS voltage auxiliary line connection pad 326 may be electrically connected to the first VSS voltage line 321 via the first connection electrode 351.

In this way, when the VSS voltage auxiliary line connection pad 326 is electrically connected to the first VSS voltage line 321 via the first connection electrode 351, an entire contact area of the first VSS voltage line 321 is enlarged, thereby to keep a resistance distribution of the first VSS voltage line 321 uniform while lowering an overall resistance thereof.

An ESD protection circuit region 371 may be disposed between the reference voltage line 341 and the display region DA. A multiplexer (MUX) circuit region 373 may be disposed between the first VSS voltage line 321 and the display region DA. However, the present disclosure is not limited thereto. The positions of ESD protection circuit region 371 and MUX circuit region 373 may vary based on a design scheme of the transparent display panel 300.

The ESD protection circuit region 371 may include a plurality of thin-film transistors constituting an ESD protection circuit. When static electricity is generated from the transparent display panel 300, the ESD protection circuit region operates to take out static electricity to an outside.

The MUX circuit region 373 may be configured to include a plurality of thin-film transistors constituting a MUX circuit.

When using the MUX circuit region 373, one channel of a driver IC output may supply a signal to two or more data lines 313. This has an advantage of reducing the number of driver ICs as used.

Each of the ESD protection circuit region 371 and the MUX circuit region 373 may be formed in a bar shape extending parallel to the reference voltage line 341 and the like. However, an arrangement form thereof is not limited thereto.

The first VDD voltage line 331 and the first VSS voltage line 321 may be disposed in an upper portion of the non-display region NDA adjacent to an upper side of the display region DA, while a second VDD voltage line 332 and a second VSS voltage line 322 may be disposed in a lower portion of the non-display region NDA adjacent to a lower side of the display region DA.

The second VDD voltage line 332 and the second VSS voltage line 322 may be spaced from each other while a spacing between the former and the display region DA is smaller than a spacing between the latter and the display region DA.

The second VDD voltage line 332 may be formed to have a bar shape, and may extend in parallel along one side face of the display region DA, specifically, along the long side of the display region DA.

The second VDD voltage line 332 is disposed to be spaced apart from the first VDD voltage line 331 while the reference voltage line 341, the first VSS voltage line 321 and the display region DA are interposed therebetween. Thus, in order to apply the VDD voltage to the second VDD voltage line 332, the first VDD voltage line 331 and the second VDD voltage line 332 may be electrically connected to each other via a separate connection electrode as a VDD voltage connection line 333.

Therefore, using the connection structure as described above, the VDD voltage supplied via the VDD voltage line connection pad 330 may be applied to the second VDD voltage line 332 via the first VDD voltage line 331 and the VDD voltage connection line 333.

In this case, at least one VDD voltage connection line 333 is disposed in the display region DA to extend across the display region DA and thus electrically connects the first VDD voltage line 331 and the second VDD voltage line 332 to each other.

In one example, the second VSS voltage line 322 may be formed to have a bar shape, and may extend in parallel along one side face of the display region DA, specifically, along the long side of the display region DA.

A width $W_2$ of the second VSS voltage line 322 may be smaller than a width $W_1$ of the first VSS voltage line 321, such that the second VSS voltage line 322 is thinner than the first VSS voltage line 321.

The second VSS voltage line 322 is disposed to be spaced apart from the first VSS voltage line 321 while the display region DA and the second VDD voltage line 332 are interposed therebetween. Thus, in order to apply the VSS voltage to the second VSS voltage line 322, the first VSS voltage line 321 and the second VSS voltage line 322 may be electrically connected to each other via a separate connection electrode as a VSS voltage connection line 323.

Therefore, using the connection structure as described above, the VSS voltage supplied via the VSS voltage line connection pad 320 may be applied to the second VSS voltage line 322 via the first VSS voltage line 321 and the VSS voltage connection line 323.

In this case, at least one VSS voltage connection line 323 may be disposed in the display region DA to extend across the display region DA and thus electrically connects the first VSS voltage line 321 and the second VSS voltage line 322 to each other.

As in one embodiment of the present disclosure, the VSS voltage line does not surround an outer periphery of the display region DA. Rather, the first VSS voltage line 321 and the second VSS voltage line 322 disposed above and below the display region DA may be electrically connected to each other via at least one VSS voltage connection line 323 extending across the display region DA. Thus, following effects may be realized.

First, non-transparent VSS voltage lines located at left and right portions of the non-display region on the left and right sides to the display region DA may be omitted. Thus, the transparent region of the bezel may be enlarged, so that the transparent region in the bezel may be increased or maximized.

Further, non-transparent VSS voltage lines located at left and right portions of the non-display region on the left and right sides to the display region DA may be omitted. Thus, the VSS voltage line-connection regions required to allow the VSS voltage lines to be placed on bezel portions left and right to the display region DA are not needed. Thus, the bezel may be slim.

For example, as in one embodiment of the present disclosure, the VSS voltage connection line 323 is disposed in the display region DA and extends across the display region DA. To the contrary, when the VSS voltage connection line 323 is disposed in left and right portions of the non-display region NDA left and right to the display region DA, the VSS voltage line is disposed to surround the display region DA and extends along an outer periphery of the display region DA.

When the VSS voltage line extends around the outer periphery of the display region DA, a size of the transparent region of the bezel is reduced because the non-transparent VSS voltage line is formed in the non-display region NDA out of the outer periphery of the display region DA, thereby to disallow reduction of the bezel area.

However, in the VSS voltage line arrangement structure according to an embodiment of the present disclosure, the VSS voltage lines are not disposed on the top, bottom, left, and right sides to the display region DA, that is, on four side portions of the bezel. Rather, it may suffice that the VSS voltage lines are disposed only in the bezel on the top and bottom sides to the display region DA.

Therefore, in the transparent display panel 300 and the transparent display device 100 according to an embodiment of the present disclosure, an increased transparent region of a bezel where the non-transparent VSS voltage line is not disposed may be secured. When necessary, a size of the bezel may be reduced, so that the bezel may be slimmer.

Further, when the VSS voltage line surrounds the outer periphery of the display region DA, the VSS voltage flows around the outer periphery of the display region DA and flows into the display region DA and then is supplied to the pixels in the display region DA. Thus, the VSS voltage line which serves as a current path must be thick in order to function as the current path in a reliable manner in terms of the electrical resistance.

However, as in one embodiment of the present disclosure, the first VSS voltage line 321 and the second VSS voltage line 322 are connected to each other via the VSS voltage connection line 323 extending across the display region DA. Thus, while the VSS voltage connection line 323 passes across the display region DA, the VSS voltage connection line may directly supply the VSS voltage to the pixel. Thus, the second VSS voltage line 322 may not serve as a current path.

In this way, when the second VSS voltage line 322 does not serve as the current path, the second VSS voltage line 322 does not need to be formed to be thick in consideration of the electrical resistance and thus be as thin as possible.

Therefore, according to an embodiment of the present disclosure, the second VSS voltage line 322 may have a width smaller than that of the first VSS voltage line 321. Thus, as the width of the second VSS voltage line 322 decreases, a size of a transparent region in a lower bezel portion below the display region DA may be increased. When necessary, a size of the lower bezel portion below the display region DA may be reduced, so that the bezel may be made slimmer.

In one example, a lighting tester 375 may be disposed in the non-display region NDA and be spaced apart from the second VSS voltage line 322 while a spacing between the former and the display region DA is larger than a spacing between the latter and the display region DA.

The lighting tester 375 may be formed in a bar shape extending parallel to the second VSS voltage line 322, and may further extend along both left and right sides of the display region DA, thereby to surround three sides of the display region DA.

The lighting tester 375 may supply a lighting test signal to a plurality of data lines 313 before a module process after the transparent display panel 300 is manufactured and may inspect a defect of the transparent display panel 300.

The lighting tester 375 includes a plurality of inspection switching elements connected to the plurality of data lines 313 respectively.

For example, the lighting tester 375 includes a plurality of red test switching elements respectively connected to data lines 313 applying a data voltage to a red sub-pixel, a plurality of green test switching elements respectively connected to data lines 313 applying a data voltage to a green sub-pixel, and a plurality of blue test switching elements respectively connected to data lines 313 applying a data voltage to a blue sub-pixel.

Therefore, the plurality of data lines 313 branched from the data line connection pad 311 extend across the display region DA and then are electrically connected to the lighting tester 375.

A lighting test signal applicator 376 may be formed on a partial region of each of the reference voltage line connection pad 340, the VDD voltage line connection pad 330, and the VSS voltage line connection pad 320 to supply the lighting test signal to the lighting tester 375.

FIG. 6 to FIG. 10 are plan views showing, based on an interlayer stacking structure, a connection relationship between the lines of FIG. 5 in the transparent display panel 300 according to an embodiment of the present disclosure.

Figure 6:
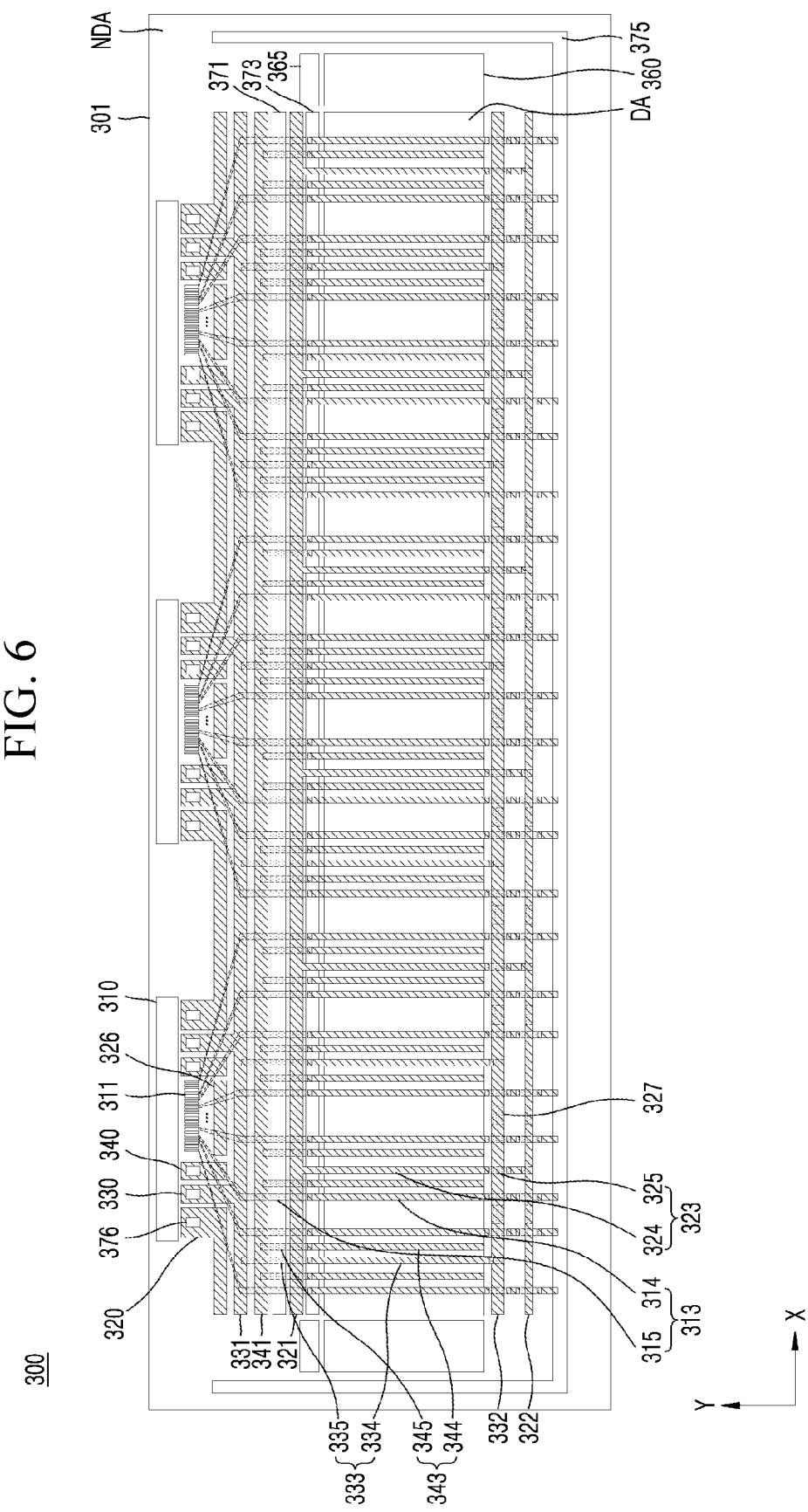
FIG. 6 to FIG. 10 are plan views showing, based on an interlayer stacking structure, a connection relationship between lines of FIG. 5 in the transparent display panel according to an embodiment of the present disclosure.

As shown in FIG. 6, the reference voltage line connection pad 340, the VDD voltage line connection pad 330, the VSS voltage line connection pad 320, the VSS voltage auxiliary line connection pad 326, the reference voltage line 341, the first VDD voltage line 331, the second VDD voltage line 332, the first VSS voltage line 321 and the second VSS voltage line 322 of the transparent display panel 300 according to an embodiment of the present disclosure may constitute the same layer and may be spaced apart from each other. In some embodiments where appropriate, constitute the same layer means that the elements (or components) are formed of the same layer or are formed on the same layer.

Specifically, the reference voltage line connection pad 340, the VDD voltage line connection pad 330, the VSS voltage line connection pad 320, the VSS voltage auxiliary line connection pad 326, the reference voltage line 341, the first VDD voltage line 331, the second VDD voltage line 332, the first VSS voltage line 321, the second VSS voltage line 322, the source electrode 217a, and the drain electrode 217b of the driving thin-film transistor 210 of a pixel may be made of the same material and may constitute the same layer.

However, as illustrated above, the VDD voltage line connection pad 330 and the first VDD voltage line 331 may be integrally formed with each other without being separated from each other.

Thus, the line connection pads and the lines constitute the same layer. Thus, the connection electrodes that electrically connect the line connection pads and the lines to each other should not form a short-circuit with other lines between the line connection pad and the line to be connected to each other, or between the lines.

For example, in order to connect the data lines 313 branched from the data line connection pad 311 to the lighting tester 375, the data line 313 may be composed of a first data line 314 and a second data line 315 which constitute different layers and are electrically connected to each other.

In this case, the first data line 314, the source electrode 217a, and drain electrode 217b of the driving thin-film transistor 210 of the pixel may constitute the same layer and may be made of the same material. The second data line 315, and the gate electrode 214 of the driving thin-film transistor 210 of the pixel may constitute the same layer and may be made of the same material.

The data line 313 applies a data signal to pixels in the display region DA. Thus, the first and second data lines 314 and 315 of the data line 313 branched from the data line connection pad 311 may constitute different layers so as not to form a short-circuit with various line connection pads and lines disposed in a region between the display region DA and the data line connection pad 311.

Thus, the second data line 315 may act as the data line 313 in a region between the display region DA and the data line connection pad 311. The first data line 314 constituting a different layer from a layer of the second data line 315 may act as the data line 313 in the display region.

Then, the second data line 315 may act as the data line 313 in a region between the display region DA and the lighting tester 375. Then, the first data line 314 as the data line 313 may be connected to the lighting tester 375.

However, the first data line 314 and the second data line 315 may act as the data line 313 in a repeatedly alternate manner such that the data line 313 does not form a short-circuit with the second VDD voltage line 332 and the second VSS voltage line 322 in regions in which the data line 313 overlaps with the second VDD voltage line 332 and the second VSS voltage line 322 in a region between the display region DA and the lighting tester 375.

Figure 11:
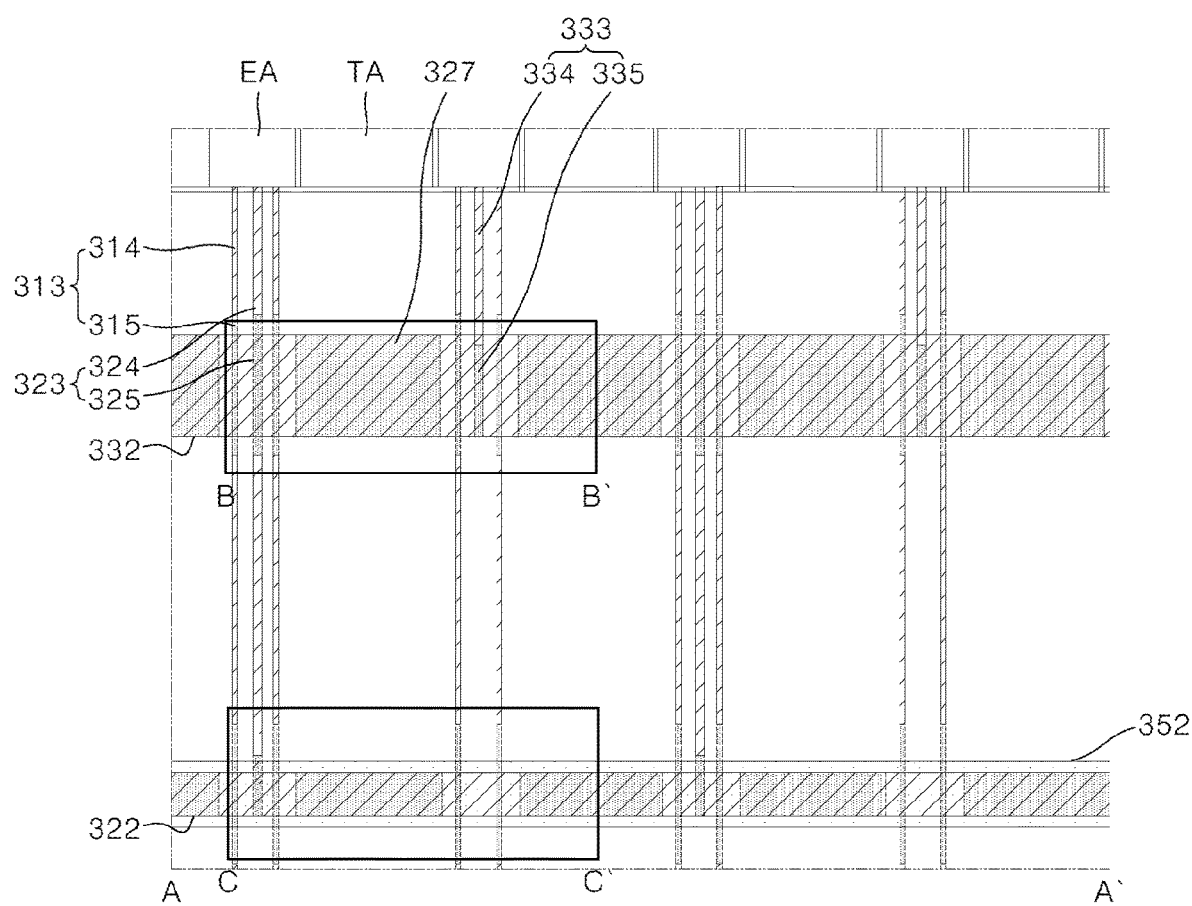
FIG. 11 is an enlarged plan view of a A-A' region in FIG. 8.
Figure 12:
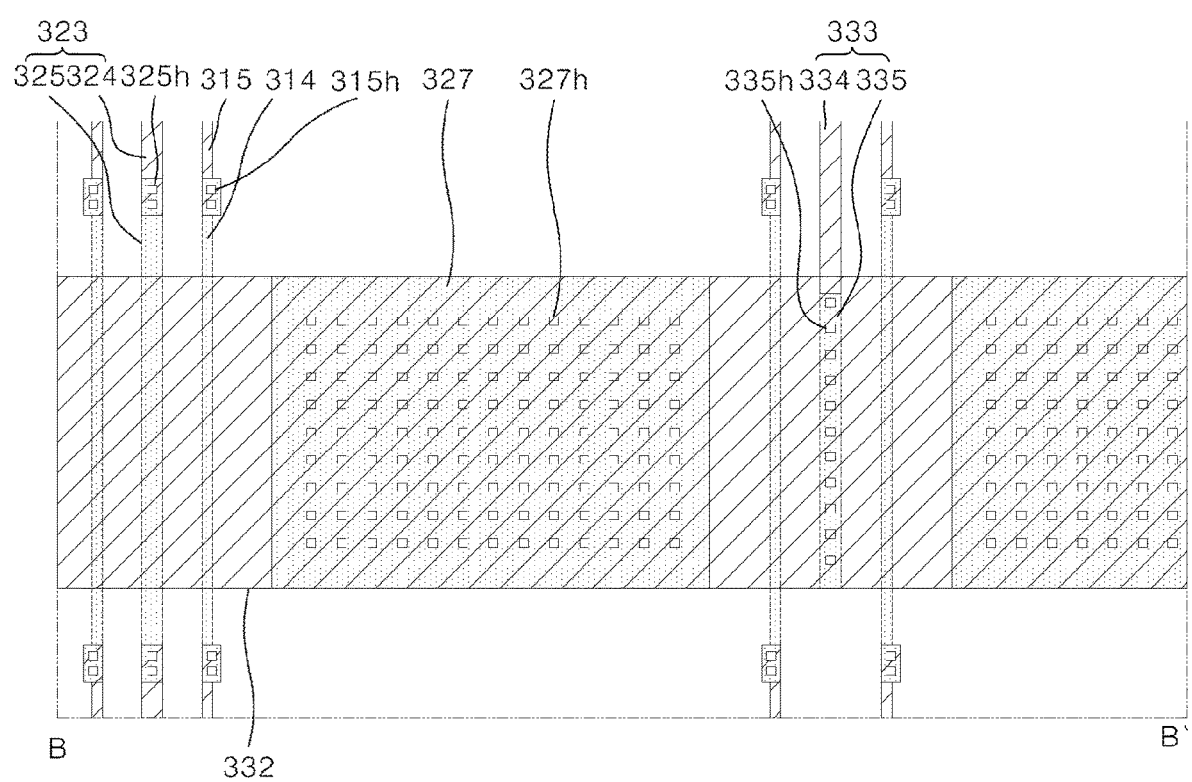
FIG. 12 is an enlarged plan view of a B-B' region of FIG. 11.
Figure 13:
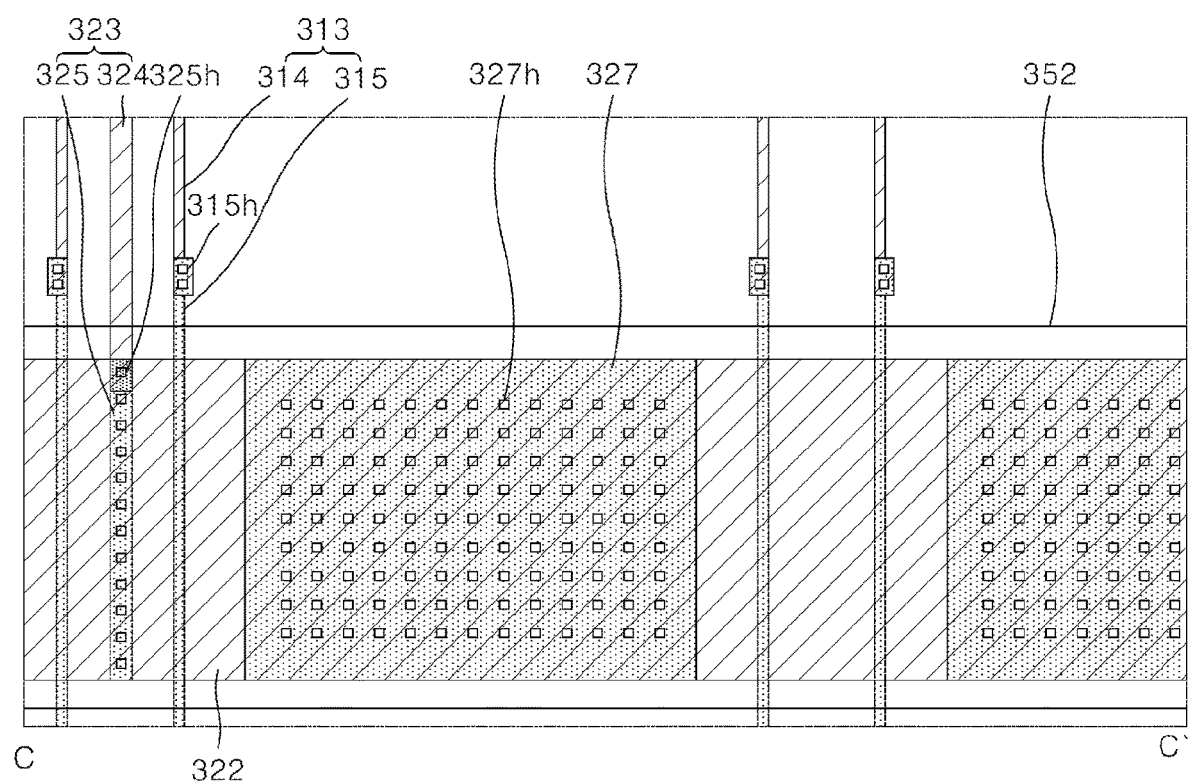
FIG. 13 is an enlarged plan view of a C-C' region of FIG. 11.

In other words, as shown in FIG. 11 to FIG. 13, the data line 313 may change from the first data line 314 to the second data line 315 in a region where the data line 313 does not overlap with the second VDD voltage line 332, such that the data line 313 does not form a short-circuit with the second VDD voltage line 332 while extending across the second VDD voltage line 332. In this way, the second data line 315 and the second VDD voltage line 332 do not constitute the same layer, thereby preventing the short circuit therebetween.

In the connection, the data line 313 changing from the first data line 314 to the second data line 315 may mean that, as shown in FIG. 12, the first data line 314 is connected to the second data line 315 via at least one contact-hole such that electrical connection therebetween is maintained, but the first data line 314 and the second data line 315 constitute different layers and are made of the different materials. This principle may be equally applied to other lines as exemplified below.

After the second data line 315 extends across the second VDD voltage line 332, the second data line may be changed back to the first data line 314 in a region where the data line 313 does not overlap with the second VDD voltage line 332.

That is, the first data line 314 and the second data line 315 may constitute different layers and are electrically connected to each other via at least one second data line contact-hole 315h.

In the same manner, the reference voltage connection line 343 may be composed of a first reference voltage connection line 344 and a second reference voltage connection line 345 which constitute different layers and are electrically connected to each other.

In this case, the first reference voltage connection line 344, the source electrode 217a and the drain electrode 217b of the driving thin-film transistor 210 of the pixel may constitute the same layer and may be made of the same material. The second reference voltage connection line 345 and the gate electrode 214 of the driving thin-film transistor 210 of the pixel may constitute the same layer and may be made of the same material.

For example, the reference voltage connection line 343 extends to a lower end of the display region DA. The reference voltage connection line 343 may be composed of the first reference voltage connection line 344 and the second reference voltage connection line 345 which constitute different layers and are electrically connected to each other.

The reference voltage connection line 343 extends across the display region DA. A distal end of the reference voltage connection line 343 need not contact a separate line.

Because the reference voltage connection line 343 applies a reference voltage to pixels in the display region DA, the reference voltage connection line 343 is composed of different reference voltage connection lines constituting different layers such that the reference voltage connection line 343 does not form a short-circuit with various line connection pads and lines in a region between the display region DA and the reference voltage line 341.

Thus, the reference voltage connection line 343 is embodied as the second reference voltage connection line 345 in a region between the display region DA and the reference voltage line 341. In the display region DA, the reference voltage connection line 343 is embodied as the first reference voltage connection line 344 which constitutes a different layer from that of the second reference voltage connection line 345.

The first reference voltage connection line 344 and the second reference voltage connection line 345 may constitute different layers and may be electrically connected to each other via at least one contact-hole.

Further, the VSS voltage connection line 323 may be composed of a first VSS voltage connection line 324 and a second VSS voltage connection line 325 constituting different layers and being electrically connected to each other.

In this case, the first VSS voltage connection line 324, the source electrode 217a and drain electrode 217b of the driving thin-film transistor 210 of the pixel may constitute the same layer and may be made of the same material. The second VSS voltage connection line 325 AND the gate electrode 214 of the driving thin-film transistor 210 of the pixel may constitute the same layer and may be made of the same material.

For example, in order to connect the VSS voltage connection line 323 to the second VSS voltage line 322, the first VSS voltage connection line 324 and the second VSS voltage connection line 325 constituting different layers are electrically connected to each other.

Since the VSS voltage connection line 323 electrically connects the first VSS voltage line 321 and the second VSS voltage line 322 sandwiching the display regions DA therebetween to each other, the first VSS voltage connection line 324 and the second VSS voltage connection line 325 of the VSS voltage connection line may constitute different layers such that the VSS voltage connection line does not form a short-circuit with various line connection pads and lines in a region between the first VSS voltage line 321 and the second VSS voltage line 322.

In one embodiment of the present disclosure, no other line is disposed between the display region DA and the first VSS voltage line 321. Thus, the VSS voltage connection line 323 extending from the first VSS voltage line 321 may be embodied as the first VSS voltage connection line 324 integrally formed with the first VSS voltage line 321 and made of the same material as that of the first VSS voltage line 321 and constituting the same layer with the first VSS voltage line 321.

The first VSS voltage connection line 324 branched from the first VSS voltage line 321 may extend across the display region DA. Then, when the VSS voltage connection line 323 extends across the second VDD voltage line 332, the first VSS voltage connection line 324 and the second VSS voltage connection line 325 may act as the VSS voltage connection line 323 in a repeatedly alternate manner such that the VSS voltage connection line 323 does not form a short-circuit with the second VDD voltage line 332 in a region where the VSS voltage connection line 323 overlaps with the second VDD voltage line 332.

In other words, as shown in FIG. 11 to FIG. 13, when the VSS voltage connection line 323 extends across the second VDD voltage line 332, the VSS voltage connection line 323 may change from the first VSS voltage connection line 324 to the second VSS voltage connection line 325 in a region where the VSS voltage connection line 323 does not overlap with the second VDD voltage line 332. Thus, when the VSS voltage connection line 323 extends across the second VDD voltage line 332, the VSS voltage connection line 323 does not form a short-circuit with the second VDD voltage line 332.

That is, the first VSS voltage connection line 324 and the second VSS voltage connection line 325 constitute different layers and are electrically connected to each other via at least one second VSS voltage connection line contact-hole 325*h*.

After the VSS voltage connection line 323 has extended across the second VDD voltage line 332, the first VSS voltage connection line 324 may be connected to the second VSS voltage line 322, as shown in FIG. 13.

In this case, the first VSS voltage connection line 324 and the second VSS voltage line 322 may be electrically connected to each other via a second VSS voltage connection line 325 connected to the first VSS voltage connection line 324 via at least one second VSS voltage connection line contact-hole 325*h*.

In addition, in a region where the second VSS voltage line 322 does not overlap with the data line 313, auxiliary lines 327 connected to the second VSS voltage line 322 via at least one auxiliary line contact-hole 327*h* are disposed below the second VSS voltage line 322.

The auxiliary line 327 and the gate electrode 214 may be made of the same material and may constitute the same layer.

The auxiliary line 327 may be connected to a rear face of the second VSS voltage line 322, thereby reducing an overall resistance of the second VSS voltage line 322.

Further, the VDD voltage connection line 333 may be composed of a first VDD voltage connection line 334 and a second VDD voltage connection line 335 constituting different layers and being electrically connected to each other.

In this case, the first VDD voltage connection line 334, the source electrode 217*a* and drain electrode 217*b* of the driving thin-film transistor 210 of the pixel may be made of the same material and may constitute the same layer. The second VDD voltage connection line 335 and the gate electrode 214 of the driving thin-film transistor 210 of the pixel may be made of the same material and may constitute the same layer.

For example, in order to connect the VDD voltage connection line 333 to the second VDD voltage line 332, the first VDD voltage connection line 334 and the second VDD voltage connection line 335 constitute different layers and are electrically connected to each other.

The VDD voltage connection line 333 electrically connects the first VDD voltage line 331 and the second VDD voltage line 332 sandwiching the display regions DA therebetween to each other. Thus, the first VDD voltage connection line 334 and the second VDD voltage connection line 335 constitute different layers so that the VDD voltage connection line 333 does not form a short-circuit with various line connection pads and lines in a region between the first and second VDD voltage lines 331 and 332.

Thus, the VDD voltage connection line 333 may be embodied as the first VDD voltage connection line 334 in a region between the first VDD voltage line 331 and the display region DA. When the VDD voltage connection line 333 extends across the display region DA, the VDD voltage connection line 333 may be embodied as the second VDD voltage connection line 335. That is, the VDD voltage connection line 333 changes from the first VDD voltage connection line 334 to the second VDD voltage connection line 335.

That is, the first VDD voltage connection line 334 and the second VDD voltage connection line 335 constitute different layers and are electrically connected to each other via at least one contact-hole.

Then, the VDD voltage connection line 333 may be embodied as the first VDD voltage connection line 334 which may be connected to the second VDD voltage line 332, as shown in FIG. 12, in a region between the display region DA and the second VDD voltage line 332.

In this case, the first VDD voltage connection line 334 and the second VDD voltage line 332 may be electrically connected to each other via the second VDD voltage connection line 335 connected to the first VDD voltage connection line 334 via at least one second VDD voltage connection line contact-hole 335*h*.

In addition, auxiliary lines 327 connected to the second VDD voltage line 332 via at least one contact-hole may be disposed in a region where the second VDD voltage line 332 does not overlap with the data line 313 and VSS voltage connection line 323.

The auxiliary line 327 and the gate electrode 214 may be made of the same material and may constitute the same layer.

The VDD voltage auxiliary line 327 may be connected to a rear face of the second VDD voltage line 332 to reduce an overall resistance of the second VDD voltage line 332.

Figure 7:
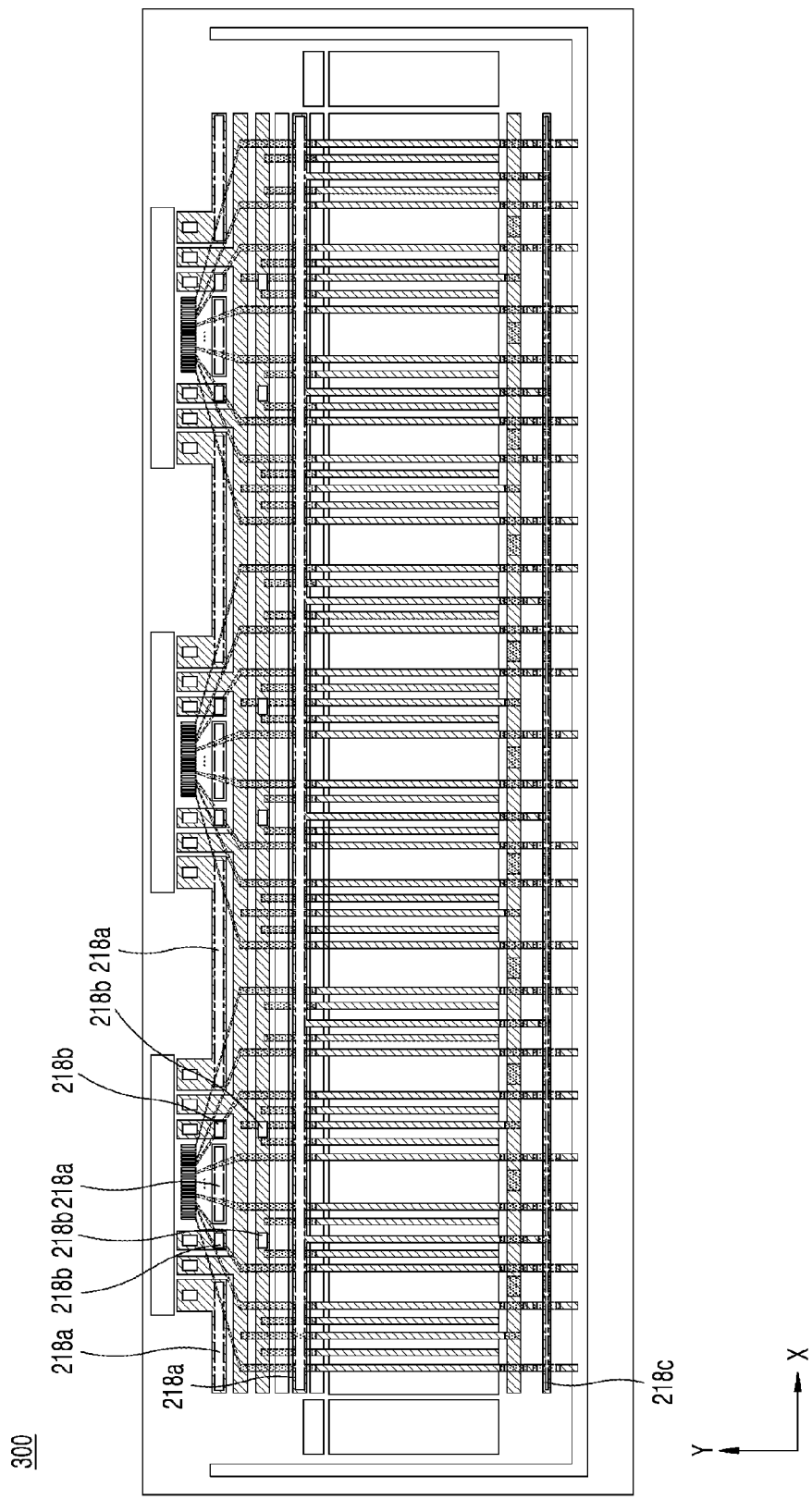
Figure 8:
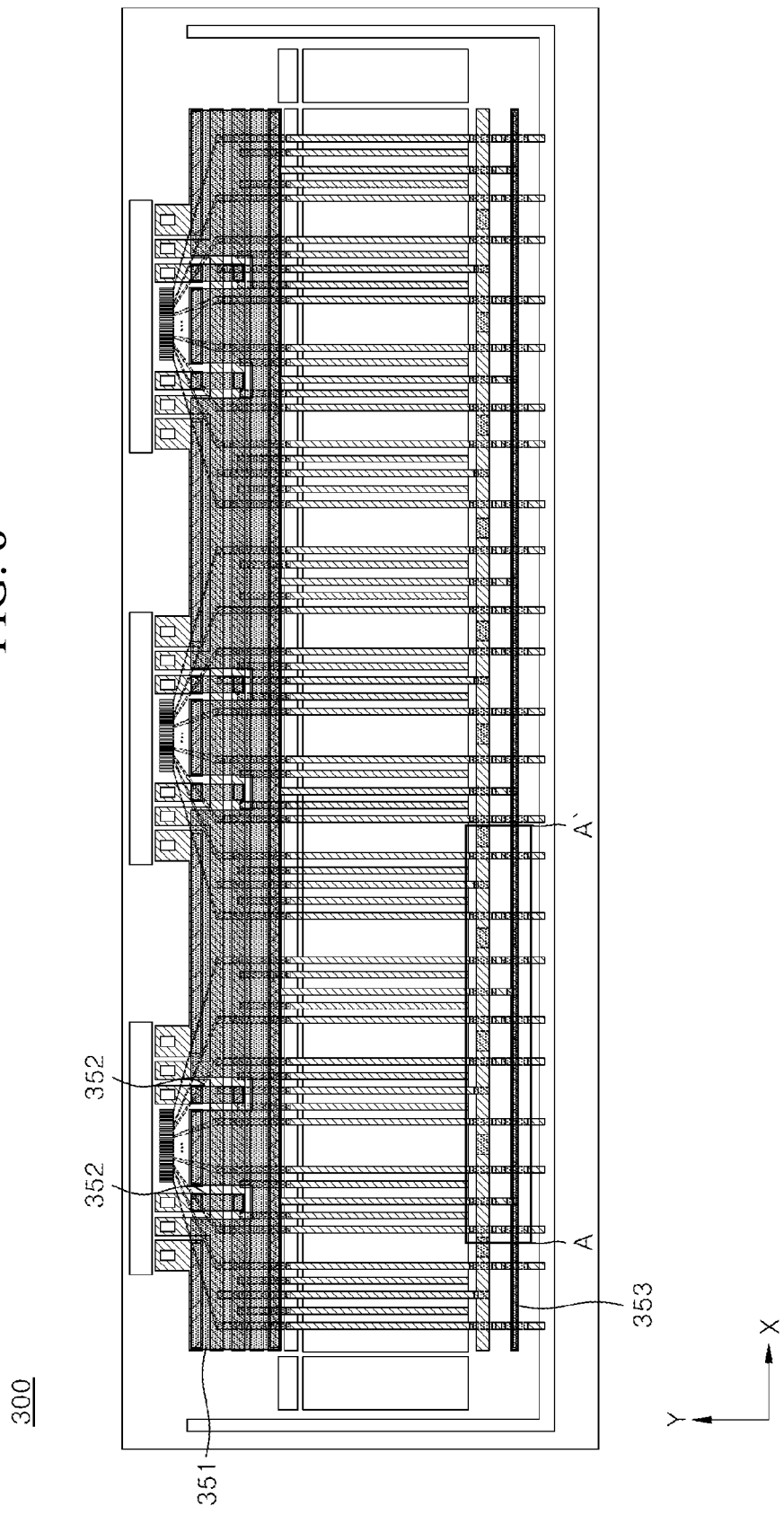

FIG. 7 additionally shows a passivation-hole formed in the passivation layer 218. FIG. 8 further shows a first connection electrode 351 connecting the VSS voltage line connection pad 320 and the first VSS voltage line 321 to each other, and a second connection electrode 352 connecting the reference voltage line connection pad 340 and the reference voltage line 341 to each other.

The passivation layer 218 may be formed on the reference voltage line connection pad 340, the VDD voltage line connection pad 330, the VSS voltage line connection pad 320, the reference voltage line 341, the first VSS voltage line 321, the second VSS voltage line 322, the first VDD voltage line 331, and the second VDD voltage line 332.

The passivation layer 218 may act as a planarization layer made of an organic material layer such as PAC, and may be formed on the various line connection pads and the lines to form a planarized top face.

Further, the passivation layer 218 serves as an insulating layer. Thus, for electrical connection between the line connection pads and the lines, a passivation-hole, that is, a planarization-hole may be formed in portions of each line connection pad and each line.

In this case, the passivation-hole means not only a contact-hole for contact, but also an open hole formed by partially removing the passivation layer 218 to secure a contact area as much as possible.

Each line connection pad and each line may be electrically connected to each other via the connection electrodes connected to each other via the planarization-hole.

In FIG. 7, in order to clarify distinction between the layers, the passivation layer 218 is not shown separately, but only a region where the passivation-hole is formed is shown in an emphasis manner.

Figure 14:
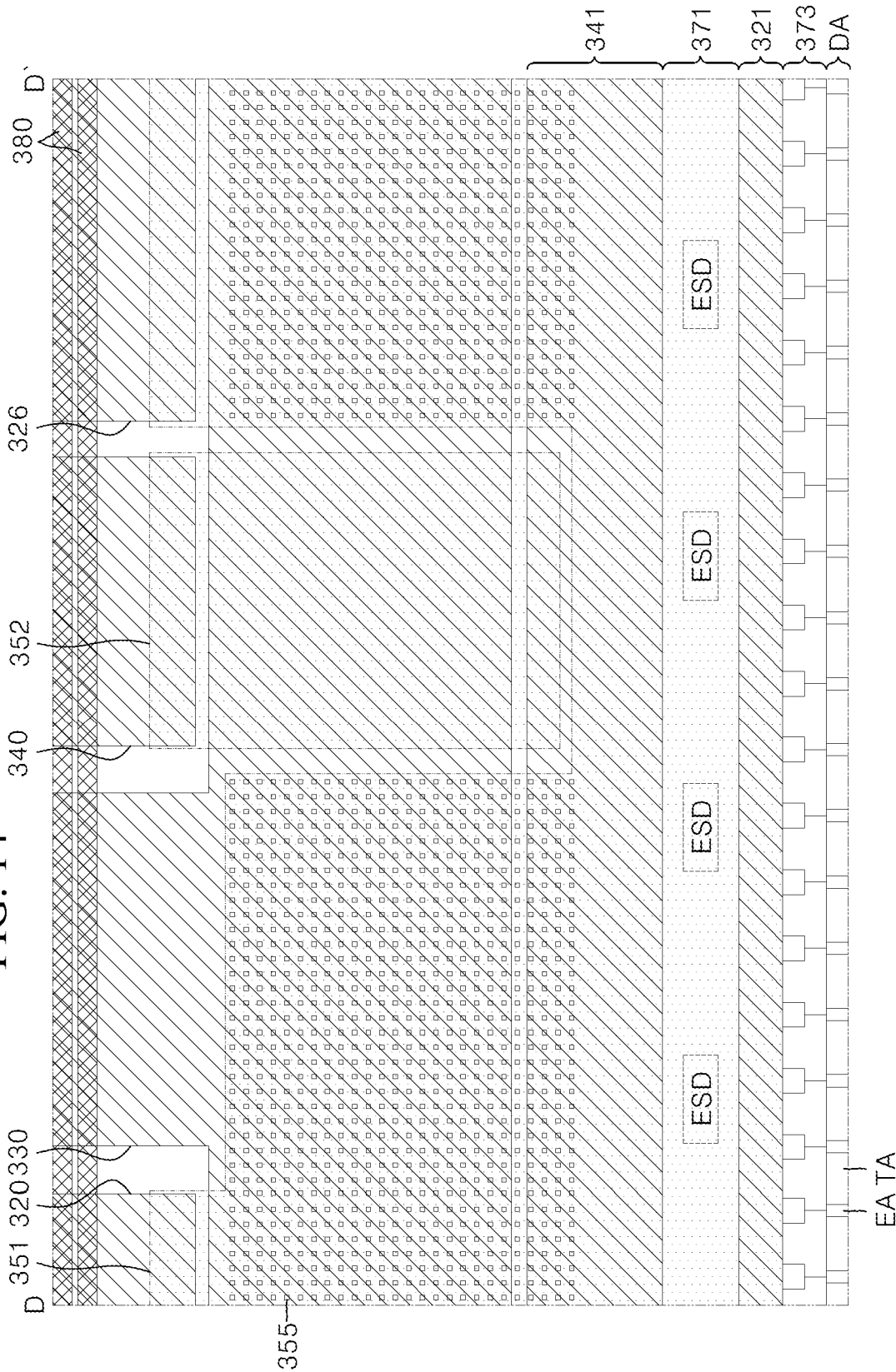
FIG. 14 is an enlarged plan view of a D-D' region of FIG. 9.

A first passivation-hole 218a is formed on the VSS voltage line connection pad 320 and the first VSS voltage line 321. The first connection electrode 351 formed on the passivation layer 218 electrically connects the VSS voltage line connection pad 320 and the first VSS voltage line 321 to each other via the first passivation-hole 218a, as shown in FIG. 8 and FIG. 14.

In other words, in order to prevent a short circuit between the VSS voltage line connection pad 320 and the first VSS voltage line 321 and the first VDD voltage line 331 and the reference voltage line 341 disposed between the VSS voltage line connection pad 320 and the first VSS voltage line 321, a jumping connection structure of an electrode to connect the VSS voltage line connection pad 320 and the first VSS voltage line 321 to each other may be beneficial.

Therefore, according to an embodiment of the present disclosure, the passivation layer 218 is formed on the first VDD voltage line 331 and the reference voltage line 341. The first passivation-hole 218a is formed on the VSS voltage line connection pad 320 and the first VSS voltage line 321.

Thus, the jumping connection structure of the electrode may be formed using the first connection electrode 351 which is formed on the passivation layer 218 and whose one portion is connected to the VSS voltage line connection pad 320 via one first passivation-hole 218a and whose an opposite portion is connected to the first VSS voltage line 321 via an opposite first passivation-hole 218a.

The first connection electrode 351 and the anode electrode as the first electrode 221 constituting the organic light-emitting element 220 of the pixel may be made of the same material and may constitute the same layer.

The first connection electrode 351 electrically connects the VSS voltage line connection pad 320 and the first VSS voltage line 321 to each other and, to this end, is preferably formed to have a large area as much as possible in order to reduce or minimize electrical resistance and to increase or maximize uniformity of the resistance distribution.

Therefore, the first connection electrode 351 may be formed to extend over the first VDD voltage line 331, the reference voltage line 341, and the first VSS voltage line 321, and thus may be formed to have an increased area or a maximum area.

However, the first connection electrode 351 does not extend over all regions of the first VDD voltage line 331 and the reference voltage line 341 and the first VSS voltage line 321. The first connection electrode 351 does not extend over a partial region such as a region of the second connection electrode 352 as described later or a spacing region between the first and second connection electrodes 351 and 352.

Further, while the first connection electrode 351 has a large area as much as possible, the first passivation-hole 218a may preferably have a large area as much as possible to increase or maximize a contact area thereof with the VSS voltage line connection pad 320 and the first VSS voltage line 321.

Therefore, the first passivation-hole 218a formed on the first VSS voltage line 321 may have a shape corresponding to the first VSS voltage line 321, that is, a long bar shape (or an elongated bar shape).

Due to the connection scheme using the first connection electrode 351, a jumping connection structure of the VSS voltage line having a reduced resistance or minimum resistance may be realized.

Further, at least one gas exhaust hole 355 may be formed in at least a partial region of the first connection electrode 351 as shown in FIG. 14.

The gas exhaust hole 355 serves to discharge unnecessary gases that may be generated during a process of forming the transparent display panel 300. Thus, when forming the gas exhaust hole 355 in the first connection electrode 351 having a large area, reliability of the transparent display panel 300 may be further enhanced.

The bank layer 231 formed on the first connection electrode 351 has open regions defined therein corresponding to the gas exhaust holes 355 to secure a passage of the gas exhaust hole 355. Each bank layer 231 may define a boundary between adjacent gas exhaust holes 355.

Further, as shown in FIG. 8, a VSS voltage auxiliary line connection pad 326 may be additionally disposed and may be electrically connected to the first VSS voltage line 321 via the first connection electrode 351.

The VSS voltage auxiliary line connection pad 326 and the VSS voltage line connection pad 320 may be made of the same material and constitute the same layer. However, the VSS voltage auxiliary line connection pad 326 has an island form separated from the VSS voltage line connection pad 320 and not connected to a separate line.

The first passivation-hole 218a is formed on the VSS voltage auxiliary line connection pad 326 such that the VSS voltage auxiliary line connection pad 326 is connected to the first connection electrode 351 via the first passivation-hole 218a, thereby increasing a total area of the first connection electrode 351, thereby reducing the overall resistance and making the resistance distribution more uniform.

In one example, the passivation layer 218 is formed on the reference voltage line connection pad 340 and the reference voltage line 341. The second connection electrode 352 formed on the passivation layer 218 electrically connects the reference voltage line connection pad 340 and the reference voltage line 341 to each other via a second passivation-hole 218b as shown in FIG. 8 and FIG. 14.

In order to prevent a short circuit between the reference voltage line connection pad 340 and the reference voltage line 341 and the first VDD voltage line 331 between the reference voltage line connection pad 340 and the reference voltage line 341, a jumping structure of an electrode for connecting the reference voltage line connection pad 340 and the reference voltage line 341 to each other may be beneficial.

Therefore, according to an embodiment of the present disclosure, the passivation layer 218 is formed on the first VDD voltage line 331, and the second passivation-hole 218b is formed on each of the reference voltage line connection pad 340 and the reference voltage line 341.

Thus, the jumping connection structure of an electrode may be formed using the second connection electrode 352 which is formed on the passivation layer 218 and whose one portion is connected to the reference voltage line connection pad 340 via one second passivation-hole 218b and whose an opposite portion is connects to the reference voltage line 341 via an opposite second passivation-hole 218b.

The second connection electrode 352 and the first connection electrode 351 may be made of the same material and may constitute the same layer but may be spaced apart from each other. Thus, the second connection electrode 352 may have an island shape.

Therefore, the second connection electrode 352 and the anode electrode as the first electrode 221 constituting the organic light-emitting element 220 of the pixel may be made of the same material and may constitute the same layer.

The second connection electrode 352 electrically connects the reference voltage line connection pad 340 and the reference voltage line 341 to each other and, to this end, is preferably formed to have a large area as much as possible in order to reduce or minimize resistance thereof and increase or maximize uniformity of resistance distribution thereof.

Further, while the second connection electrode 352 has a large area as much as possible, the second passivation-hole 218b is formed to have a large area as much as possible to increase or maximize a contact area thereof with the reference voltage line connection pad 340 and the reference voltage line 341.

Due to the connection approach using the second connection electrode 352, the jumping connection structure of the reference voltage line 341 with a reduced resistance or minimum resistance may be realized.

Further, at least one gas exhaust hole 355 may be formed in a partial region of the second connection electrode 352 as in the first connection electrode 351.

In one example, a third passivation-hole 218c may be formed on the second VSS voltage line 322, as shown in FIG. 7. As shown in FIG. 8, a third connection electrode 353 may be formed on the third passivation-hole 218c.

The third passivation-hole 218c formed on the second VSS voltage line 322 is intended for connecting the second VSS voltage line 322 and the third connection electrode 353 to each other. The third connection electrode 353 is electrically connected to the second VSS voltage line 322 via the third passivation-hole 218c.

In order to reduce the resistance by increasing or maximizing the contact area between the second VSS voltage line 322 and the third connection electrode 353, the third passivation-hole 218c formed on the second VSS voltage line 322 may have a bar shape corresponding to the second VSS voltage line 322.

Further, when forming the third connection electrode 353 at a lower end portion of the transparent display panel 300, an effect may occur that a difference between vertical levels of the lower end portion of the transparent display panel 300 and an upper end portion of the transparent display panel 300 in which the first connection electrode 351 and the second connection electrode 352 may be removed.

The third connection electrode 353, the first connection electrode 351 and the second connection electrode may be made of the same material and may constitute the same layer but may be spaced apart from each other. Thus, the third connection electrode 353 is formed to have an island shape.

Accordingly, the third connection electrode 353 and the anode electrode as the first electrode 221 constituting the organic light-emitting element 220 of the pixel may be made of the same material and may constitute the same layer.

The bank layer 231 may be formed on the first connection electrode 351, the second connection electrode 352 and the third connection electrode 353.

Figure 9:
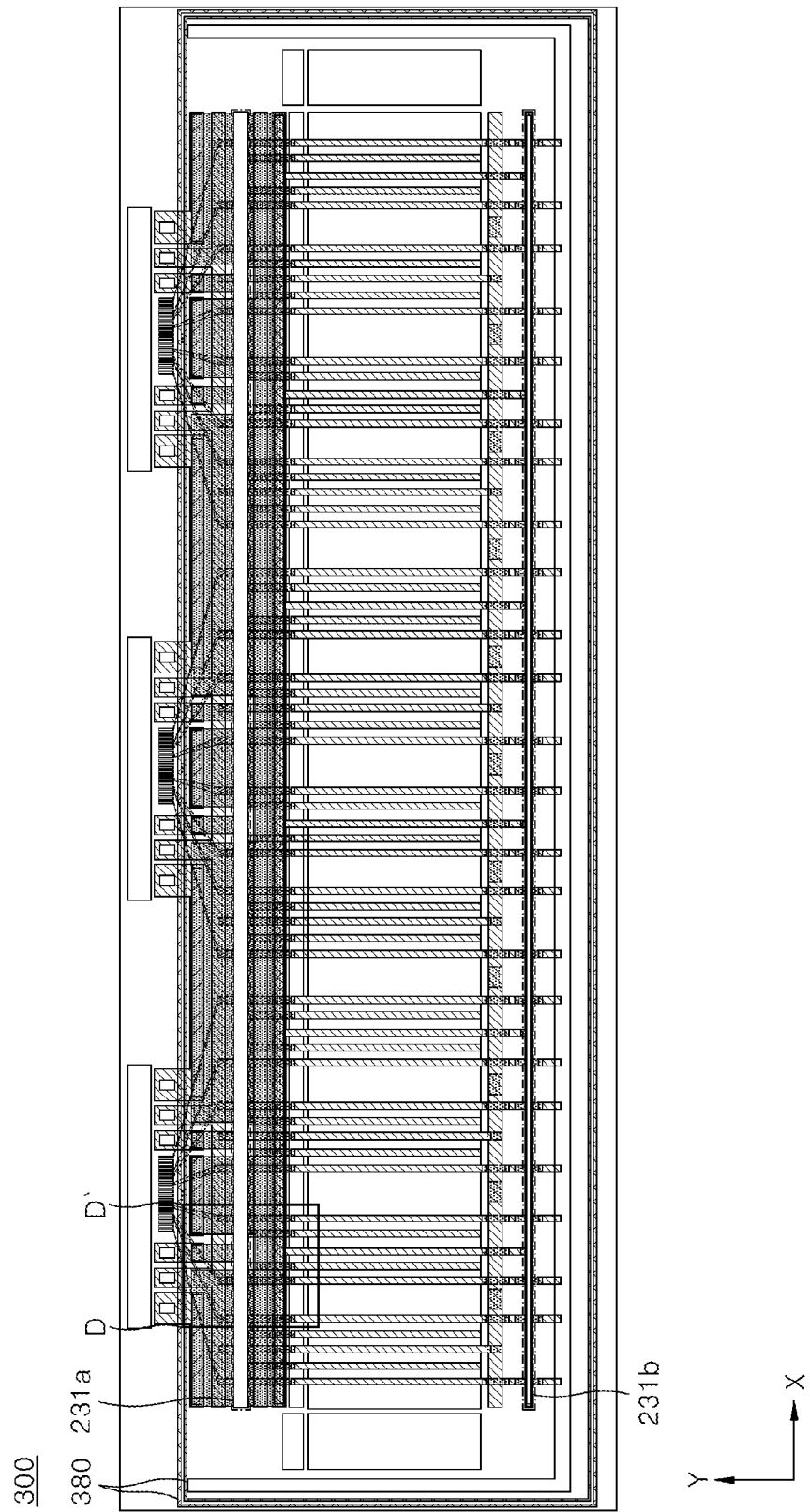

As shown in FIG. 9, the bank layer 231 may form a dam 380 disposed in the non-display region NDA to surround the display region DA. In this case, the dam 380 may include at least one dam 380 as patterned.

When forming the encapsulating layer 250 on the first substrate 200, the dam 380 may serve to prevent an encapsulating material used to form the encapsulating layer 250 from flowing to an outside.

Specifically, the dam 380 may be disposed in the non-display region NDA as shown in FIG. 9, and may be disposed to surround the lighting tester 375 and the first VDD voltage line 331 disposed in the non-display region NDA.

In one example, a fourth connection electrode 354 is formed on the bank layer 231, and is connected to the cathode electrode as the second electrode 225 of the pixel.

The fourth connection electrode 354 is electrically connected to the VSS voltage line to apply a VSS voltage to the cathode electrode of the pixel.

In this case, the cathode electrode and the fourth connection electrode 354 may be formed integrally with each other.

Thus, in one embodiment of the present disclosure, one end of the fourth connection electrode 354 is electrically connected to the first connection electrode 351 to which the VSS voltage is applied, while the other end of the fourth connection electrode 354 is electrically connected to the third connection electrode 353, thereby to apply the VSS voltage to the cathode electrode.

Figure 10:
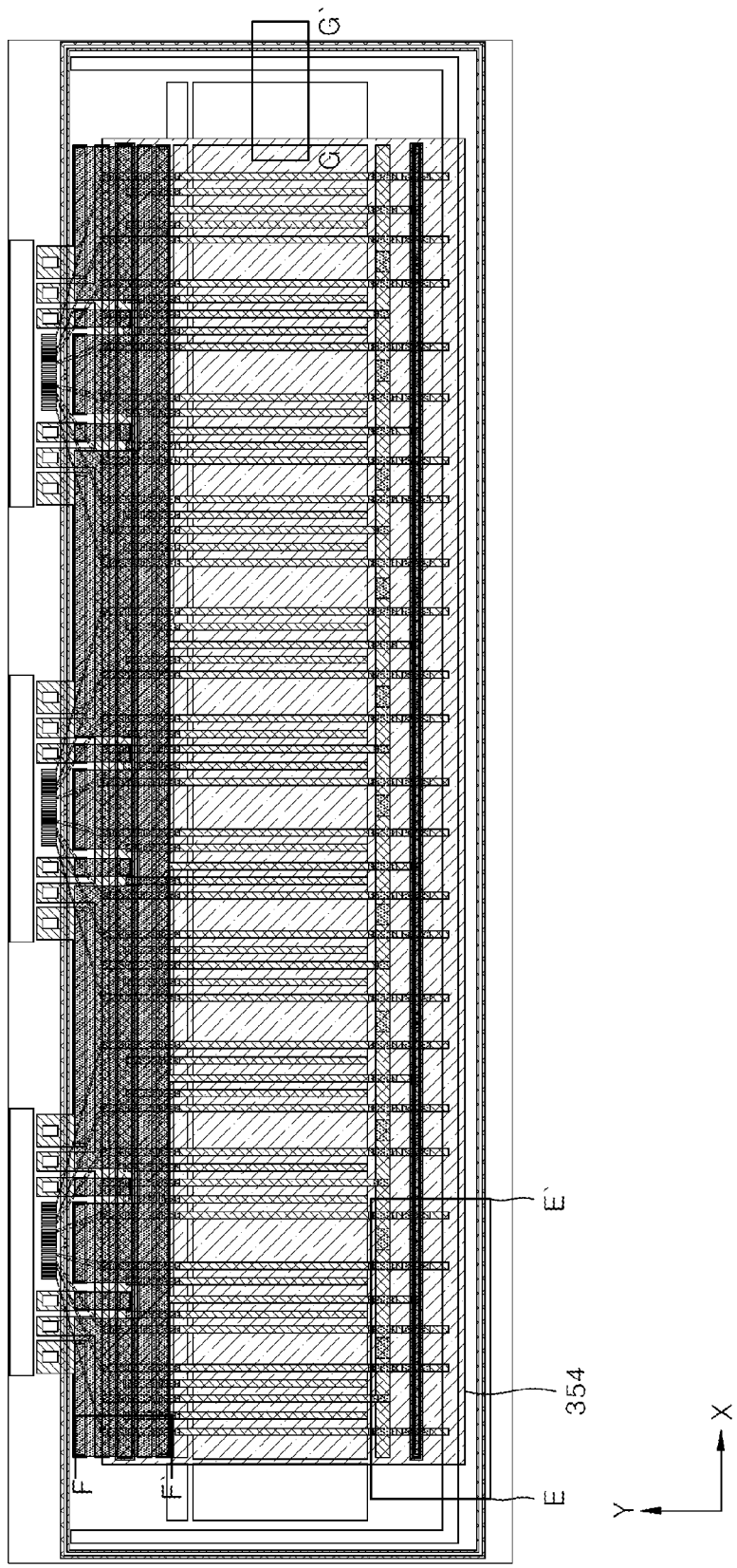
Figure 16:
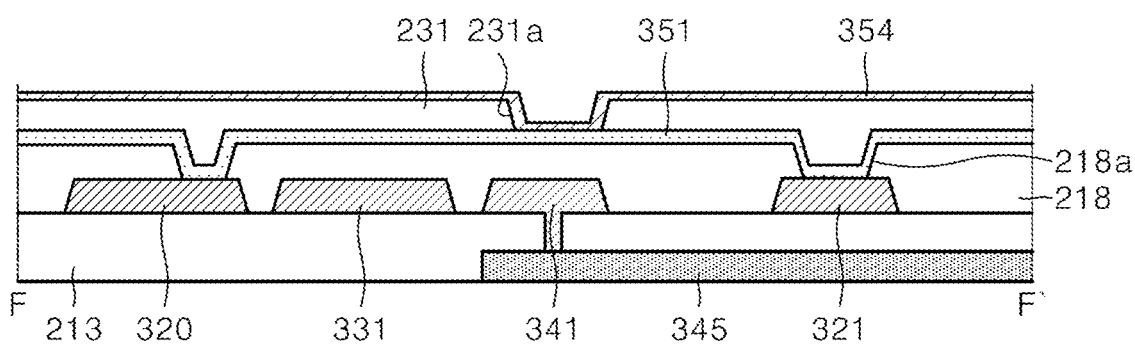
FIG. 16 is an enlarged cross-sectional view of a F-F' region in FIG. 10.

Specifically, as shown in FIG. 9, FIG. 10 and FIG. 16, the bank layer 231 is formed on the first connection electrode 351. A first bank-hole 231a is formed on the first connection electrode 351 and is formed by removing a partial region of the bank layer 231, thereby to expose the first connection electrode 351 to an outside. Thus, the first connection electrode 351 may be electrically connected to one end of the fourth connection electrode 354 via the first bank-hole 231a.

When the VSS voltage is applied to the fourth connection electrode 354, the fourth connection electrode 354 is not directly connected to the first VSS voltage line 321, but the fourth connection electrode 354 is connected thereto via the first connection electrode 351 made of a same material as an anode electrode, thereby to reduce an electrical resistance.

To increase or maximize the contact area between the first connection electrode 351 and the fourth connection electrode 354, the first bank-hole 231a of the bank layer 231 on the first connection electrode 351 may be formed in a bar shape as in the reference voltage line 341.

Further, the first bank-hole 231a may be formed in a corresponding manner to the reference voltage line 341 or the first VSS voltage line 321.

For example, when the first bank-hole 231a is formed on a separate circuit region such as an ESD protection circuit region 371 rather than on the line such as the reference voltage line 341 or the first VSS voltage line 321, there may be a problem that the bank-hole is formed in a region where a flatness is poor.

Further, when the first bank-hole 231a is formed on a line far away from the first VSS voltage line 321 such as the first VDD voltage line 331, the fourth connection electrode 354 which is electrically connected to the first VSS voltage line 321 via the first bank-hole 231a is far away from the first VSS voltage line 321. Thus, as a current path becomes longer, the resistance increases correspondingly.

For example, when the fourth connection electrode 354 is used as a transparent cathode electrode as a high resistance line, the resistance thereof may be high. Thus, when a length of a connection to the fourth connection electrode 354 as the cathode electrode of the high resistance rather than the anode electrode of the low resistance is larger, the overall resistance may be greater.

Thus, according to an embodiment of the present disclosure, the first bank-hole 231a is preferably formed on the reference voltage line 341 or the first VSS voltage line 321.

When the first bank-hole 231a is formed on the reference voltage line 341, an inclined face of the hole may be removed to obtain a high flatness, thereby to reduce resistance variation than when a bank-hole is formed in a portion of the bank layer 231 on which no line is formed.

Further, when the first bank-hole 231a is formed on the first VSS voltage line 321, a length of a connection between the fourth connection electrode 354 and the first VSS voltage line 321 becomes smaller, thereby reducing the resistance.

As shown in FIG. 9 and FIG. 10, a second bank-hole 231b formed by removing a partial region of bank layer 231 is formed in a portion of the bank layer 231 on the third connection electrode 353 electrically connected to the second VSS voltage line 322, thereby to electrically connect an opposite portion of the fourth connection electrode 354 to the third connection electrode 353.

In this case, the second bank-hole 231b is formed to correspond to a third passivation-hole 218c on the second VSS voltage line 322. Thus, while the second VSS voltage line 322, the third connection electrode 353 and the fourth connection electrode 354 are in a stacked state, they electrically contact each other at the same position. For example, in some cases, the second bank-hole 231b overlaps with a third passivation-hole 218c on the second VSS voltage line 322.

In addition, the second VSS voltage line 322 is not directly connected to the cathode electrode, but is connected thereto via the third connection electrode 353 as a low-resistance anode electrode, thereby to reduce resistance.

Due to the connection structure of the fourth connection electrode 354, the VSS voltage may be applied to the fourth connection electrode 354. Thus, the VSS voltage may be applied to the cathode electrode of the organic light-emitting element 220.

That is, the VSS voltage applied from the VSS voltage line connection pad 320 may be applied to the fourth connection electrode 354 via the first VSS voltage line 321 and the first connection electrode 351.

The fourth connection electrode 354 may extend across an entirety of the display region DA including the first VDD voltage line 331, the reference voltage line 341, the first VSS voltage line 321, the second VDD voltage line 332 and the second VSS voltage line 322.

Figure 15:
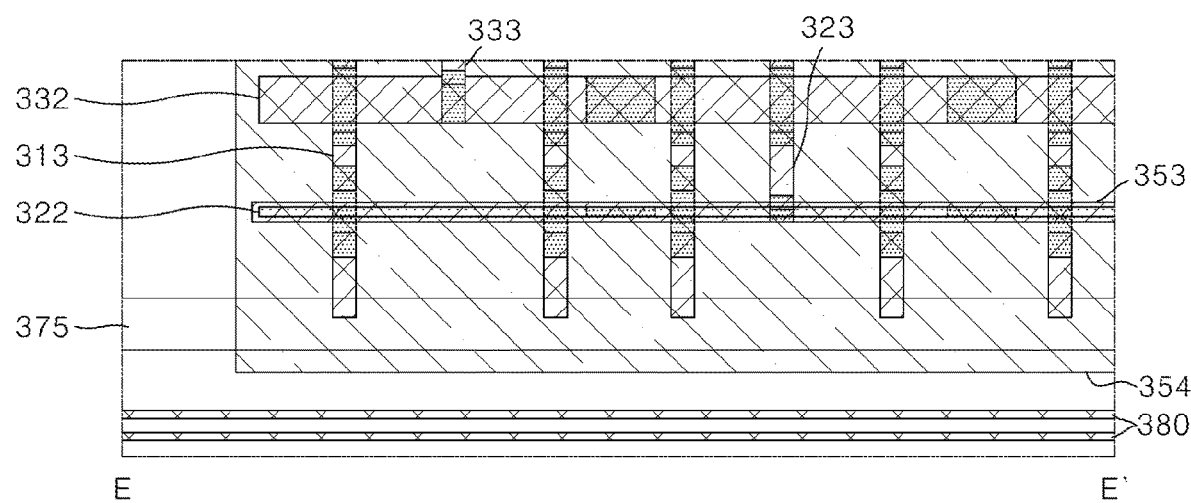
FIG. 15 is an enlarged plan view of a E-E' region of FIG. 10.

For example, as shown in FIG. 15, the cathode electrode may extend across an entirety of the display region DA including the second VDD voltage line 332 and the second VSS voltage line 322, and may be surrounded with the dam 380.

Figure 17:
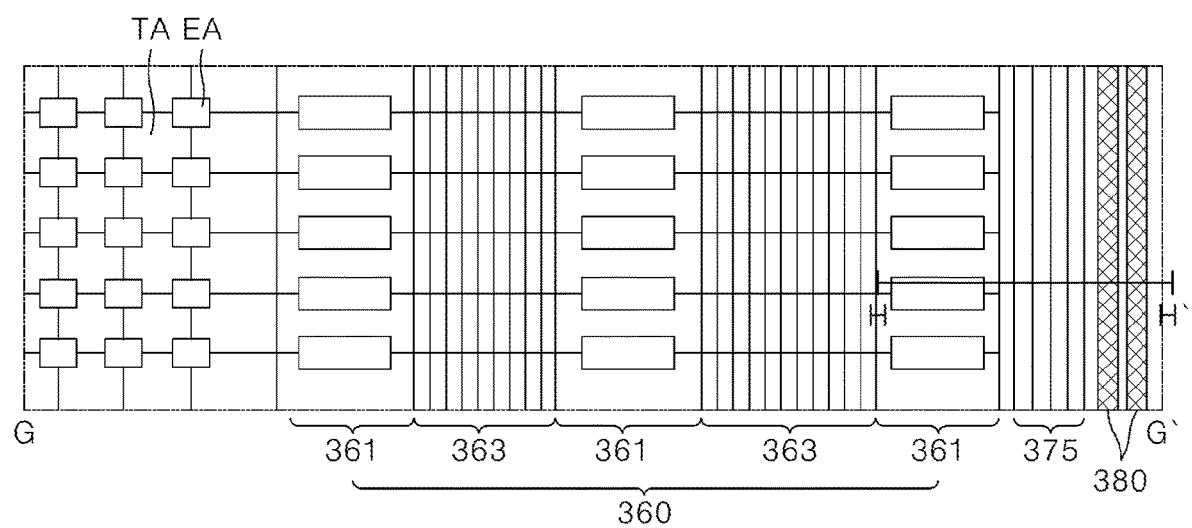
FIG. 17 is an enlarged plan view of a G-G' region of FIG. 10.

In one example, the GIP circuit region 360 includes a GIP division block 361 and a clock signal line region 363, as shown in FIG. 17.

The GIP division block 361 includes at least one GIP division block that divides the gate lines GL into multiple blocks and drives each of the multiple blocks in each of multiple display driving periods. The clock signal line region 363 may include at least one clock signal lines to control nodes of the GIP circuit region 360.

According to an embodiment of the present disclosure, the GIP division block 361 and the clock signal line region 363 may be alternately arranged in a direction away from the display region DA.

Specifically, in one embodiment of the present disclosure, non-transparent and thick VSS voltage lines may be omitted in left and right portions of the non-display region NDA left and right to the display region DA. Thus, the GIP circuit region 360 may occupy a region increased by the omitted area.

Therefore, the components such as the GIP division block 361 and the clock signal line region 363 constituting the GIP circuit region 360 may be arranged in a non-compacted manner. Thus, a transparent region may be secured even in the GIP circuit region 360.

For example, in a case where a space occupied by the GIP circuit region 360 is narrow, the GIP division block 361 and the clock signal line region 363 must be arranged in a very dense manner to increase or maximize space utilization. Thus, it is difficult to secure a separate transparent region In the GIP circuit region 360.

To the contrary, when the space occupied by the GIP circuit region 360 increases as in one embodiment of the present disclosure, the GIP division block 361 having a non-transparent region at a larger amount and the clock signal line region 363 having a transparent region at a larger amount may be alternately arranged in the GIP circuit region 360 in a distinguished manner. Thus, the transparent region may be secured to the maximum even in the GIP circuit region 360.

Figure 18:
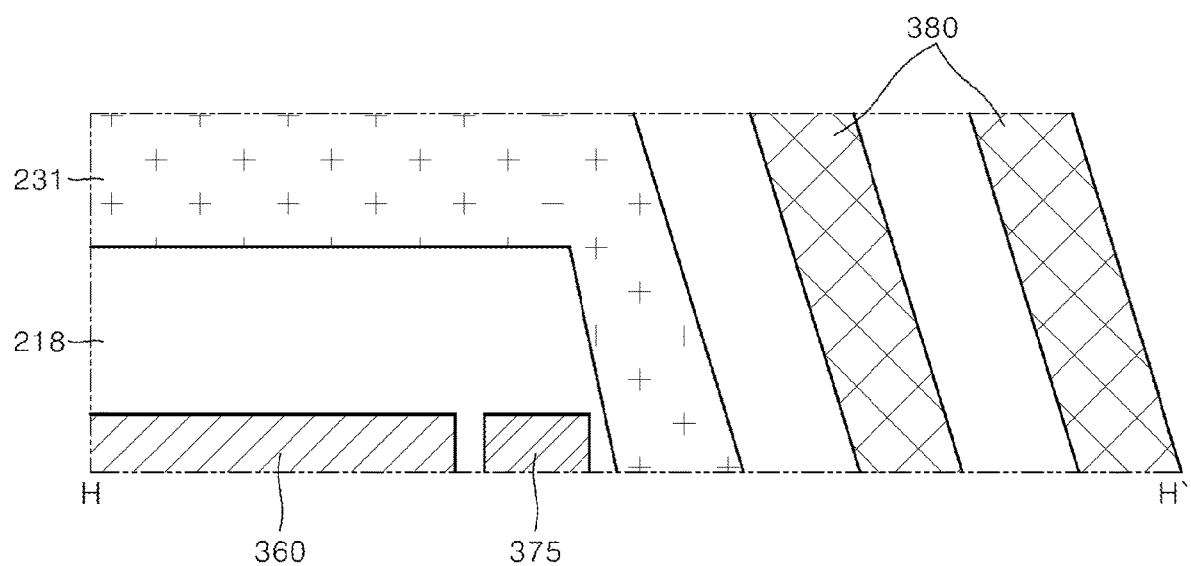
FIG. 18 is an enlarged cross-sectional view of a H-H' region of FIG. 17.

In other words, according to one embodiment of the present disclosure, the VSS voltage line is omitted in one side region of the non-display region NDA out of the display region DA where the GIP circuit region 360 is disposed, as shown in FIG. 17 and FIG. 18. Thus, reduction of a transparent region due to the non-transparent VSS voltage line may be reduced or minimized.

Therefore, the lighting tester 375 may be disposed between the dam 380 and the GIP circuit region 360, but the VSS voltage line may not be disposed between the dam 380 and the GIP circuit region 360.

The transparent display panel 300 according to an embodiment of the present disclosure as described above includes the display region DA and the non-display region NDA, wherein the panel includes the first VSS voltage line 321 and the second VSS voltage line 322 disposed in the non-display region NDA while the display region DA is interposed therebetween, and at least one VSS voltage connection line 323 to electrically connect the first VSS voltage line 321 and the second VSS voltage line 322 to each other. The VSS voltage connection line 323 is disposed in the display region DA.

In this case, the second VSS voltage line 322 may be thinner than the first VSS voltage line 321.

Further, the display region DA includes a long side and a short side. Each of the first VSS voltage line 321 and the second VSS voltage line 322 may have a bar shape, and extend along the long side of the display region DA.

Further, the transparent display panel 300 according to an embodiment of the present disclosure further includes the VSS voltage line connection pad 320 disposed to be spaced apart from the first VSS voltage line 321, wherein the latter is closer to the display region DA than the former is. The first VSS voltage line 321 and the VSS voltage line connection pad 320 may be electrically connected to each other via the first connection electrode 351.

In this case, the display region DA includes at least one light-emitting region EA and at least one transmissive region TA. The light-emitting region EA includes the organic light-emitting element 220 including the first electrode 221, the organic light-emitting layer 223 and the second electrode 225. The first connection electrode 351 is made of the same material as the first electrode 221 and may constitute the same layer therewith.

Further, the transparent display panel 300 according to an embodiment of the present disclosure further includes a first VDD voltage line 331 and a second VDD voltage line 332 disposed in the non-display region NDA while the display region DA is interposed therebetween, and the at least one VDD voltage connection line 333 electrically connecting the first VDD voltage line 331 and the second VDD voltage line 332 to each other. The VDD voltage connection line 333 may be disposed in the display region DA.

Further, the first VSS voltage line 321 may be disposed between the first VDD voltage line 331 and the display region DA. The second VDD voltage line 332 may be disposed between the second VSS voltage line 322 and the display region DA.

In addition, the transparent display panel 300 according to an embodiment of the present disclosure further includes the reference voltage line 341 disposed between the first VDD voltage line 331 and the first VSS voltage line 321, and the reference voltage line connection pad 340 spaced apart from the reference voltage line 341 such that the latter is closer to the display region DA than the former is. The reference voltage line 341 and the reference voltage line connection pad 340 may be electrically connected to each other via the second connection electrode 352.

In this case, the first connection electrode 351 and the second connection electrode 352 may be made of the same material and may constitute the same layer.

Further, the light-emitting region EA includes the driving thin-film transistor 210 connected to the organic light-emitting element 220. The driving thin-film transistor 210 may include the gate electrode 214, the source electrode 217a, the drain electrode 217b and the active layer 212. The first VSS voltage line 321, the second VSS voltage line 322, the first VDD voltage line 331, the second VDD voltage line 332, and the reference voltage line 341 are made of the same material as the source electrode 217a and the drain electrode 217b and may constitute the same layer therewith.

The VSS voltage connection line 323 may include the first VSS voltage connection line 324 and the second VSS voltage connection line 325. The first VSS voltage connection line 324 may be made of the same material as the source electrode 217a and the drain electrode 217b and may constitute the same layer therewith. The second VSS voltage connection line 325 may be made of the same material as the gate electrode 214, and may constitute the same layer therewith.

The VDD voltage connection line 333 may include the first VDD voltage connection line 334 and the second VDD voltage connection line 335. The first VDD voltage connection line 334 may be made of the same material as the source electrode 217a and the drain electrode 217b, and may constitute the same layer therewith. The second VDD voltage connection line 335 may be made of the same material as the gate electrode 214 and may constitute the same layer therewith.

The reference voltage connection line 343 may include the first reference voltage connection line 344 and the second reference voltage connection line 345. The first reference voltage connection line 344 may be made of the same material as the source electrode 217a and drain electrode 217b and may constitute the same layer therewith. The second reference voltage connection line 345 may be made of the same material as the gate electrode 214, and may constitute the same layer therewith.

The passivation layer 218 may be formed on the first VDD voltage line 331, the reference voltage line 341 and the first VSS voltage line 321. On the passivation layer 218, the first connection electrode 351 may be formed. On the first connection electrode 351, the bank layer 231 and the first bank-hole 231a formed by removing a partial region of the bank layer 231 may be formed. The second electrode 225 may be formed on the bank layer 231. One portion of the second electrode 225 may be connected to the first connection electrode 351 via the first bank-hole 231a.

The at least one auxiliary line 327 may contact a bottom face of at least one of the second VDD voltage line 332 and the second VSS voltage line 322. The auxiliary line 327 may be made of the same material as the gate electrode 214 and may constitute the same layer therewith.

In this case, the first bank-hole 231a may correspond to the reference voltage line 341 or the first VSS voltage line 321. For example, in some cases, the first bank-hole 231a may overlap with either the reference voltage line 341 or the first VSS voltage line 321.

On the second VSS voltage line 322, the passivation layer 218 and the passivation-hole formed by removing the partial region of the passivation layer 218 may be formed. On the passivation layer 218, the third connection electrode 353 connected to the second VSS voltage line 322 via the passivation-hole may be formed. On the third connection electrode 353, the bank layer 231 and the second bank-hole 231b formed by removing a partial region of the bank layer 231 may be formed. The second electrode 225 may be formed on the bank layer 231. The opposite portion of the second electrode 225 may be connected to the third connection electrode 353 via the second bank-hole 231b.

In this case, at least one of the first connection electrode 351 and the second connection electrode 352 may have at least one gas exhaust hole 355 defined therein.

Further, the transparent display panel 300 according to another embodiment according to the present disclosure may include the display region DA including the light-emitting region EA and the transmissive region, the first VSS voltage line 321 and second VSS voltage line 322 while the display region DA is interposed therebetween; and the GIP circuit region 360 disposed in at least one side region out of the display region DA. The first VSS voltage line 321 and the second VSS voltage line 322 are electrically connected to each other via the at least one VSS voltage connection line 323. The VSS voltage connection line 323 may extend across the display region DA.

In this case, the transparent display panel 300 according to another embodiment according to the present disclosure may include the reference voltage line 341, the first VDD voltage line 331 and the data drive IC pad 310 which are spaced from the first VSS voltage line and are spaced from each other, wherein a spacing between the reference voltage line and the display region is smaller than a spacing between the first VDD voltage line and the display region which is smaller than a spacing between the data drive IC pad and the display region. Between the display region DA and the second VSS voltage line 322, the second VDD voltage line 332 may be disposed. Between the first VDD voltage line 331 and the data drive IC pad 310, the first VSS voltage line connection pad, the first VDD voltage line connection pad, the reference voltage line connection pad 340 and the data line connection pad 311 may be disposed.

Further, between the reference voltage line 341 and the first VSS voltage line 321, the ESD protection circuit region 371 may be disposed. Between the display region DA and the first VSS voltage line 321, the MUX circuit region 373 may be disposed. The lighting tester 375 may be spaced away from the second VSS voltage line 322 such that the latter is closer to the display region DA than the former is.

In this case, the lighting tester 375 may be connected to the data line 313 branched from the data line connection pad 311.

The GIP circuit region 360 may be disposed in one side region out of the display region DA different from one side region out of the display region DA in which the first VSS voltage line 321 and second VSS voltage line 322 are disposed.

The GIP circuit region 360 includes the GIP division block 361 and the clock signal line region 363. The GIP division block 361 and the clock signal line region 363 may be alternately arranged in a direction away from the display region DA.

The at least one dam 380 may extend around the outer periphery of the display region DA to surround the GIP circuit region 360, the lighting tester 375 and the first VDD voltage line 331. The dam 380 may be made of the same material as the planarization layer, the bank layer, and a spacer layer and constitute the same layer therewith.

An additional lighting tester 375 may be disposed between the dam 380 and the GIP circuit region 360. The VSS voltage line may be absent between the dam 380 and the GIP circuit region 360.

The transparent display device 100 according to an embodiment of the present disclosure may include the transparent display panel 300 as illustrated above, the data driver 120 for supplying the data voltage to the transparent display panel 300, the gate driver 130 for supplying the scan signal to the transparent display panel 300, and the timing controller 140 that controls the gate driver 130 and the data driver 120.

As described above, the present disclosure is described with reference to the drawings. However, the present disclosure is not limited by the embodiments and drawings disclosed in the present specification. It will be apparent that various modifications may be made thereto by those skilled in the art within the scope of the present disclosure. Furthermore, although the effect resulting from the features of the present disclosure has not been explicitly described in the description of the embodiments of the present disclosure, it is obvious that a predictable effect resulting from the features of the present disclosure should be recognized.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a transparent display panel including a display region and a non-display region adjacent to the display region, the display region including a light-emitting region and a transmissive region;
a first VSS voltage line;
a second VSS voltage line, wherein the display region is between the first VSS voltage line and the second VSS voltage line;
a first VDD voltage line;
a second VDD voltage line, wherein the display region is between the first VDD voltage line and the second VDD voltage line;
a plurality of VSS voltage connection line electrically connecting the first VSS voltage line and the second VSS voltage line to each other; and
a plurality of VDD voltage connection line electrically connecting the first VDD voltage line and the second VDD voltage line to each other,
wherein the plurality of VSS voltage connection line and the plurality of VDD voltage connection line disposed in the display region extends across the display region, and wherein each VSS voltage connection line and each VDD voltage connection line are arranged alternately with each other.

2. The display device of claim 1, wherein the transparent display panel further comprises a reference voltage line, and a data drive IC pad which are spaced apart from the first VSS voltage line and are spaced apart from each other, wherein a spacing between the reference voltage line and the display region is smaller than a spacing between the first VDD voltage line and the display region which is smaller than a spacing between the data drive IC pad and the display region,
wherein the second VDD voltage line is disposed between the display region and the second VSS voltage line, and
wherein the transparent display panel further comprises a first VSS voltage line connection pad, a first VDD voltage line connection pad, a reference voltage line connection pad and a data line connection pad disposed between the first VDD voltage line and the data drive IC pad.

3. The display device of claim 2, wherein the transparent display panel further comprises:
an electro-static discharge protection circuit region disposed between the reference voltage line and the first VSS voltage line;
a multiplexer circuit region disposed between the display region and the first VSS voltage line; and
a lighting tester spaced from the second VSS voltage line, wherein the second VSS voltage line is closer to the display region than the lighting tester, and
wherein the lighting tester is electrically connected to a data line branched from the data line connection pad.

4. The display device of claim 1, further comprising a gate in panel (GIP) circuit region disposed in at least one side region outside of the display region,
wherein the GIP circuit region is disposed in other side region outside of the display region different from one side region outside of the display region in which the first VSS voltage line and the second VSS voltage line are disposed,
wherein the GIP circuit region includes a GIP division block and a clock signal line region, and wherein the GIP division block and the clock signal line region are alternately arranged in a direction away from the display region.

5. The display device of claim 4,
wherein the transparent display panel further comprises at least one dam extending along an outer periphery of the display region to surround the GIP circuit region, the lighting tester, and the first VDD voltage line,
wherein a bank layer forms the dam,
wherein the transparent display panel further comprises an additional lighting tester disposed between the dam and the GIP circuit region, and
wherein the VSS voltage line is absent between the dam and the GIP circuit region.

6. The display device of claim 1, wherein the transparent display panel further comprises:
a VSS voltage line connection pad disposed to be spaced apart from the first VSS voltage line; and
a first connection electrode electrically connecting the VSS voltage line connection pad and the first VSS voltage line to each other,
wherein the light-emitting region includes an organic light-emitting element including a first electrode, an organic light-emitting layer, and a second electrode, and
wherein the first connection electrode is made of a same material as a material of the first electrode, and the first connection electrode and the first electrode constitute the same layer.

7. The display device of claim 6, wherein the first connection electrode is located between the display region and the VSS voltage line connection pad.

8. The display device of claim 1, wherein the light-emitting region includes a driving thin-film transistor,
wherein the driving thin-film transistor includes a gate electrode, a source electrode, a drain electrode, and an active layer, and
wherein the first VSS voltage line, the second VSS voltage line, the source electrode, and the drain electrode are made of the same material and constitute the same layer.

9. The display device of claim 7, wherein the at least one VSS voltage connection line includes a plurality of VSS voltage connection lines.

10. The display device of claim 7, wherein the at least one VSS voltage connection line includes a first VSS voltage connection line and a second VSS voltage connection line to provide a plurality of VSS voltage connection lines that extend across the display,
wherein the first VSS voltage connection line, the source electrode, and the drain electrode are made of the same material and constitute the same layer, and
wherein the second VSS voltage connection line and the gate electrode are made of the same material and constitute the same layer.

11. The display device of claim 4, wherein the gate in panel (GIP) circuit region includes a transparent region.

* * * * *